United States Patent
Yokoyama et al.

(10) Patent No.: US 9,184,613 B2
(45) Date of Patent: Nov. 10, 2015

(54) SECONDARY BATTERY STATE DETECTING APPARATUS AND SECONDARY BATTERY STATE DETECTING METHOD

(71) Applicants: Furukawa Electric Co., Ltd., Tokyo (JP); Furukawa Automotive Systems Inc., Shiga (JP)

(72) Inventors: Koichi Yokoyama, Tokyo (JP); Etsuzo Sato, Shiga (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 440 days.

(21) Appl. No.: 13/769,646

(22) Filed: Feb. 18, 2013

(65) Prior Publication Data

US 2013/0154544 A1  Jun. 20, 2013

Related U.S. Application Data

(63) Continuation of application No. PCT/JP2011/079813, filed on Dec. 22, 2011.

(30) Foreign Application Priority Data

Jan. 6, 2011  (JP) .................................. 2011-001074
Feb. 25, 2011  (JP) .................................. 2011-040144

(51) Int. Cl.
*H01M 10/44* (2006.01)
*H01M 10/46* (2006.01)
(Continued)

(52) U.S. Cl.
CPC ........... *H02J 7/0054* (2013.01); *G01R 31/3624* (2013.01); *H02J 7/0052* (2013.01); *G01R 31/3648* (2013.01); *G01R 31/3662* (2013.01)

(58) Field of Classification Search
CPC ..... H02J 7/0034; H02J 7/0054; H02J 7/0029; H02J 7/0036; H02J 2007/0037; H02J 2007/004
USPC .................. 320/104, 105, 127, 128, 134, 136
See application file for complete search history.

(56) References Cited

U.S. PATENT DOCUMENTS

2006/0186859 A1  8/2006  Fujikawa et al.
2009/0128157 A1  5/2009  Moriya

FOREIGN PATENT DOCUMENTS

CN      1821801 A    8/2006
CN    101326446 A   12/2008
(Continued)

OTHER PUBLICATIONS

Office Action dated Oct. 10, 2014 for corresponding Chinese Patent Application No. 201180057777.6.

(Continued)

*Primary Examiner* — Edward Tso
(74) *Attorney, Agent, or Firm* — Thompson Coburn LLP

(57) ABSTRACT

A secondary battery state detecting apparatus for detecting a state of a secondary battery installed in a vehicle is provided, which includes a current detecting unit that detects an electric current flowing to the secondary battery, a voltage detecting unit that detects a voltage of the secondary battery, and a determining unit that determines, in a case where an external device is directly connected to terminals of the secondary battery and the secondary battery is charged or discharged without passing through the current detecting unit, whether or not an irregular charging-discharging has occurred, in accordance with a change in a current value and a voltage value detected by the current detecting unit and the voltage detecting unit.

14 Claims, 13 Drawing Sheets

(51) Int. Cl.
*H02J 7/00* (2006.01)
*G01R 31/36* (2006.01)

(56) References Cited

FOREIGN PATENT DOCUMENTS

| | | |
|---|---|---|
| JP | H10-253682 A | 9/1998 |
| JP | 2007-225562 A | 9/2007 |
| JP | 2009-002691 A | 1/2009 |
| JP | 2009-300209 A | 12/2009 |

OTHER PUBLICATIONS

Japanese Patent Application No. 2011-001074, Office Action dated Jan. 6, 2014.
Japanese Patent Application No. 2011-040144, Office Action dated Jan. 20, 2014.

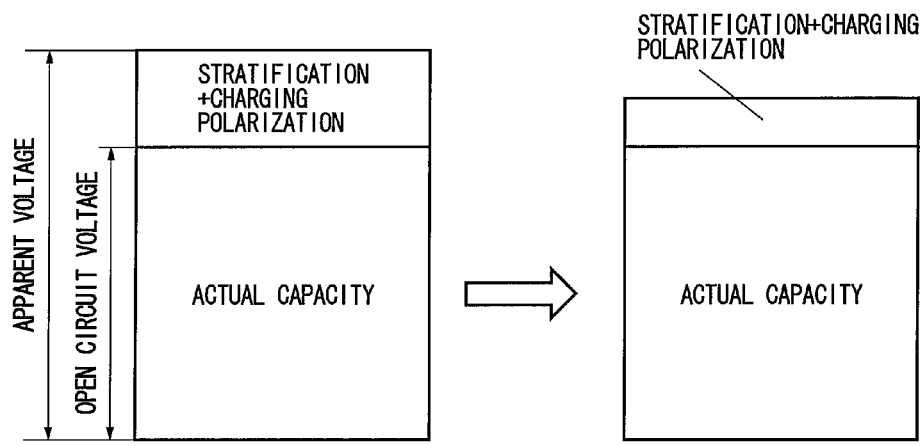
F I G. 4
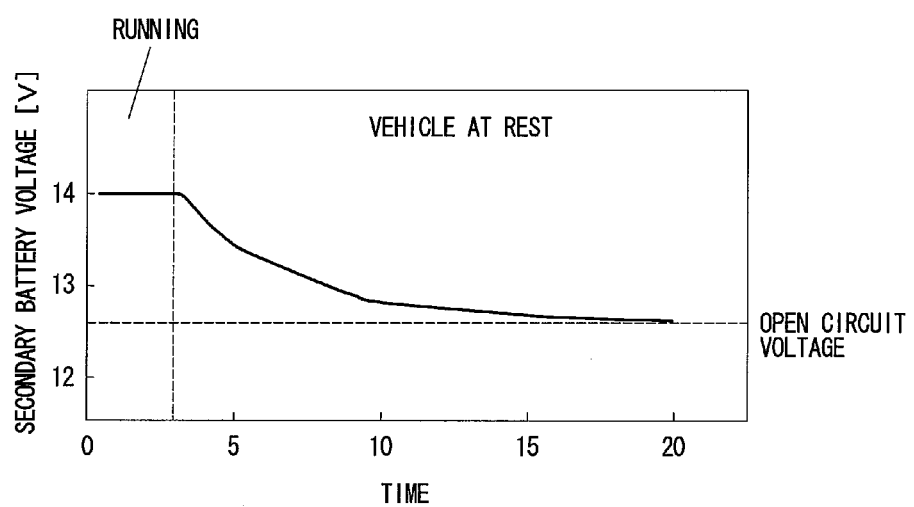
F I G. 5

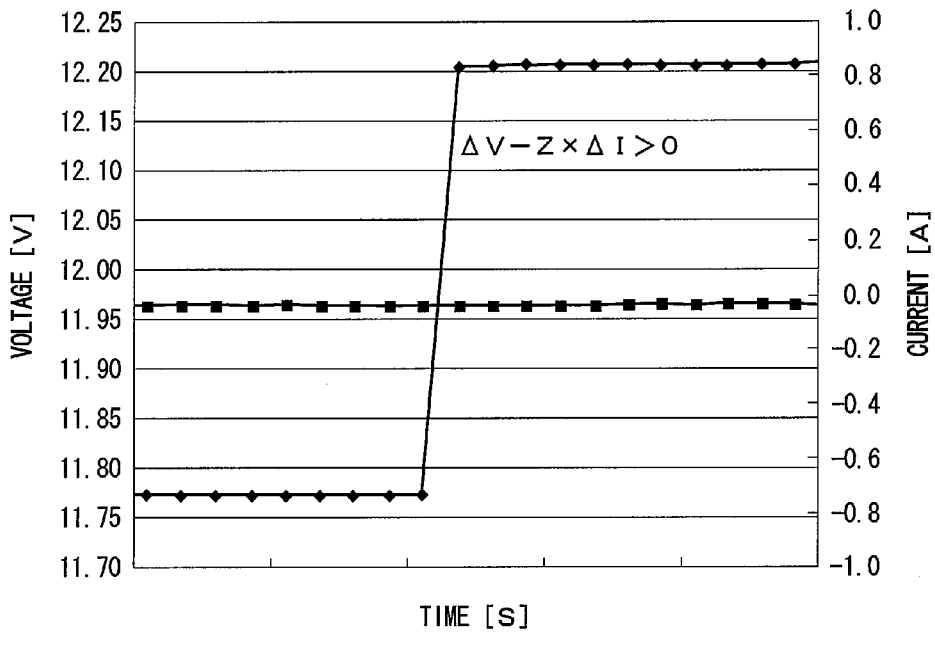
F I G. 7
F I G. 8

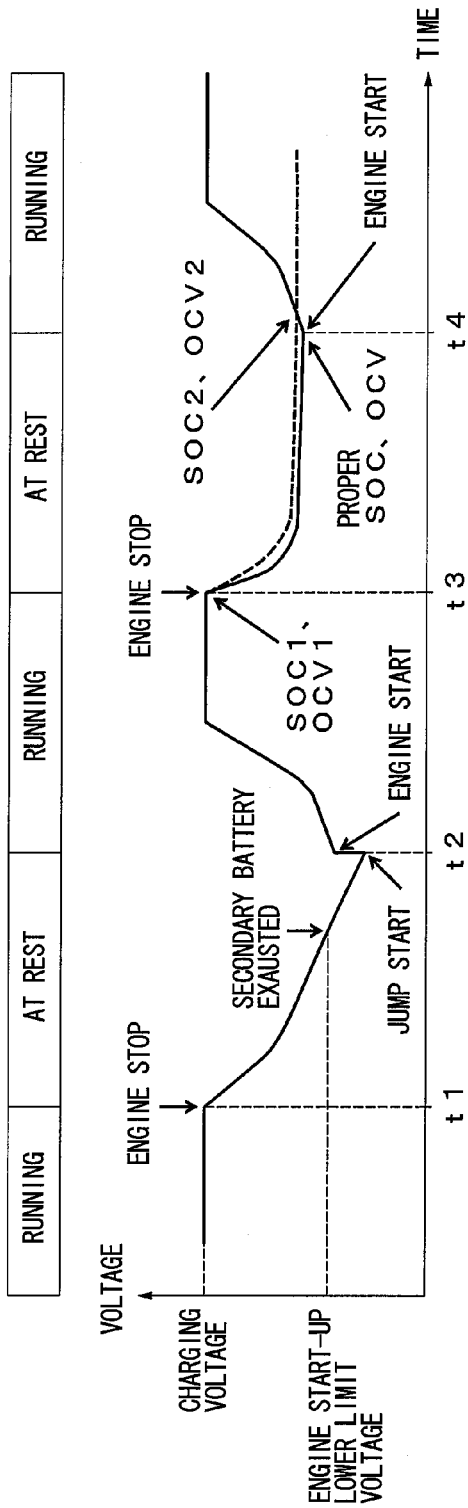
F I G. 10

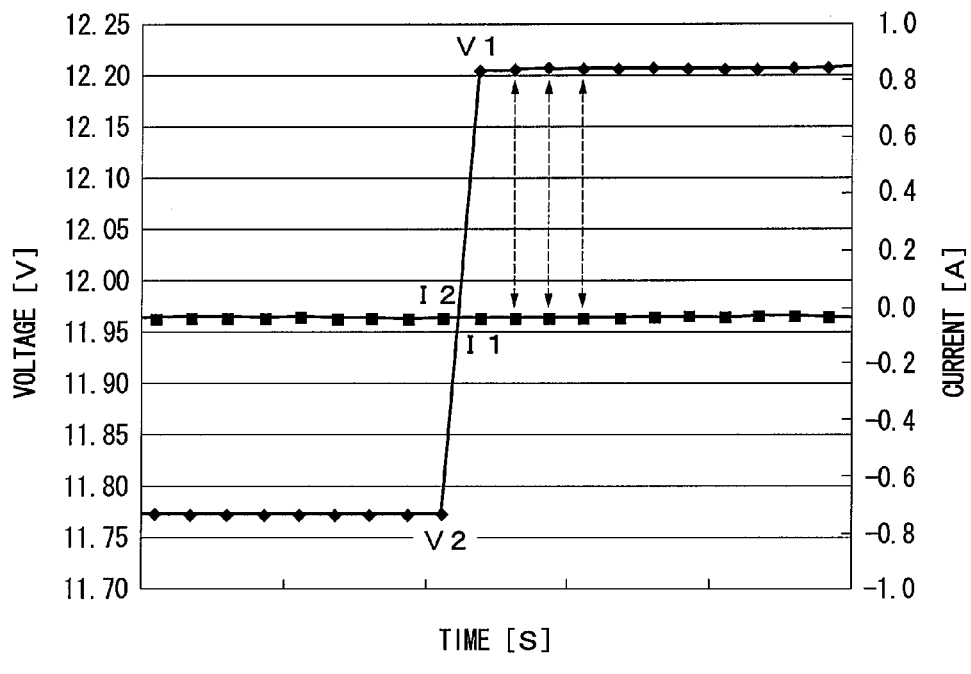
F I G. 1 4
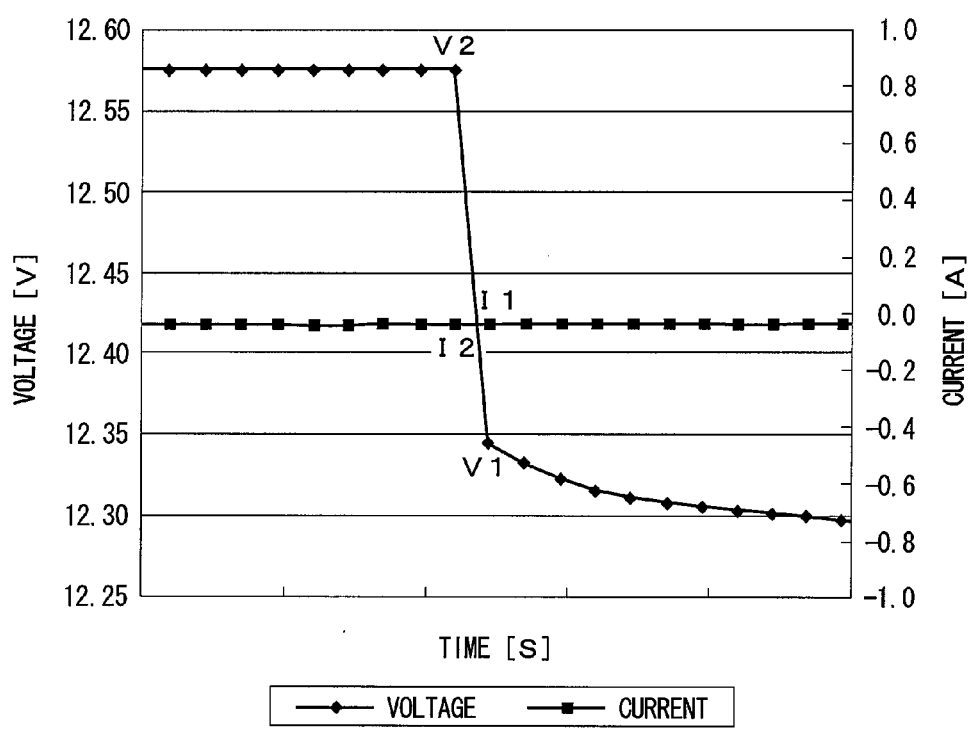
F I G. 1 6

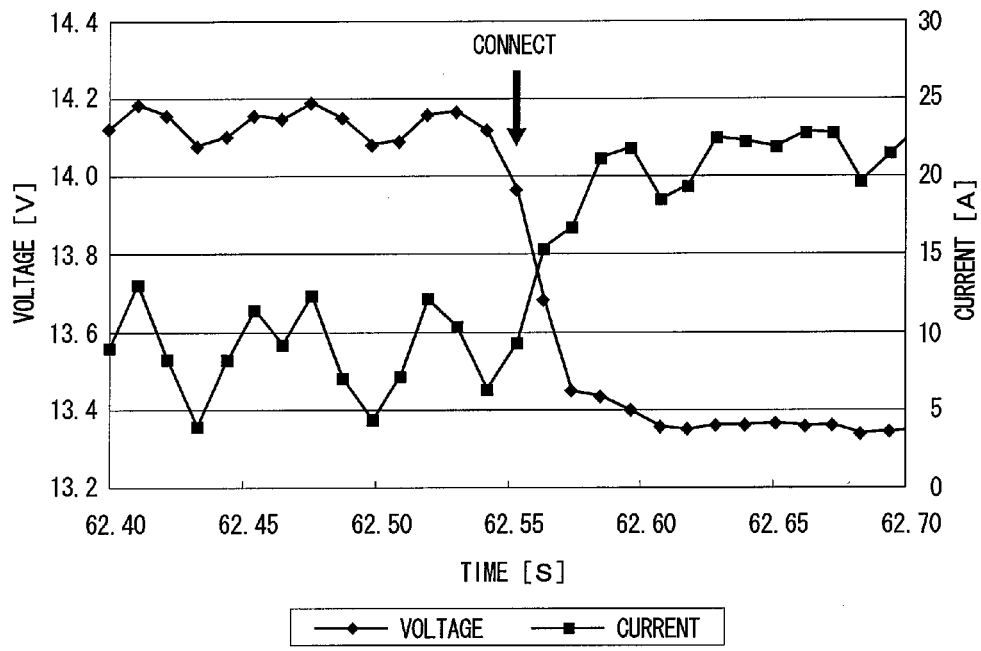
F I G. 1 7
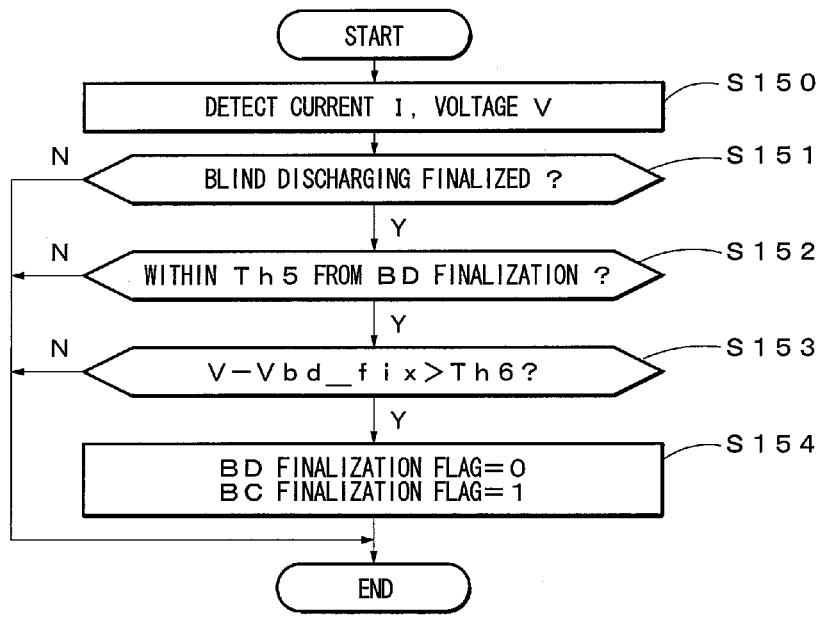
F I G. 1 8

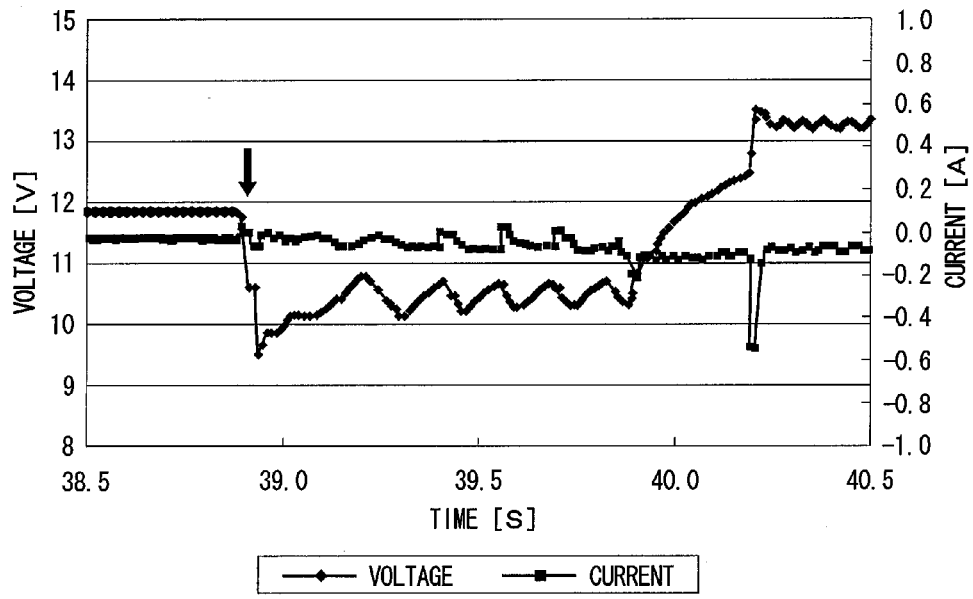
F I G. 1 9
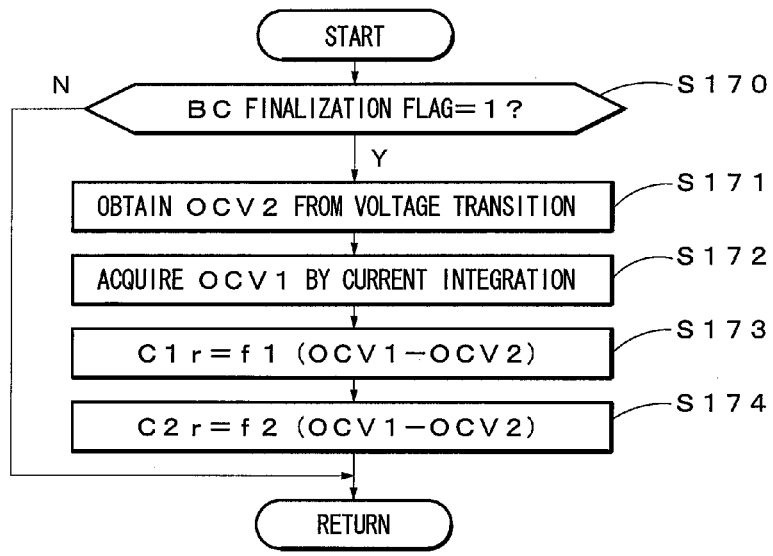
F I G. 2 0

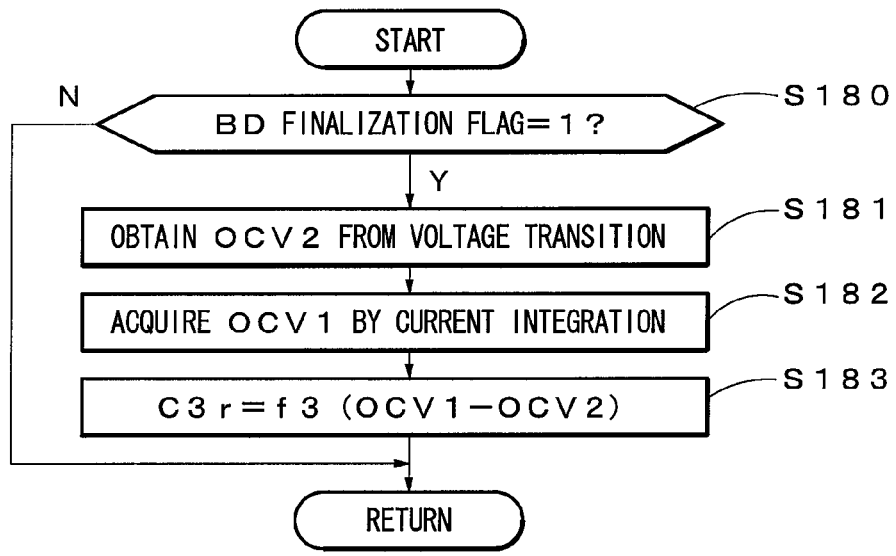
F I G. 21
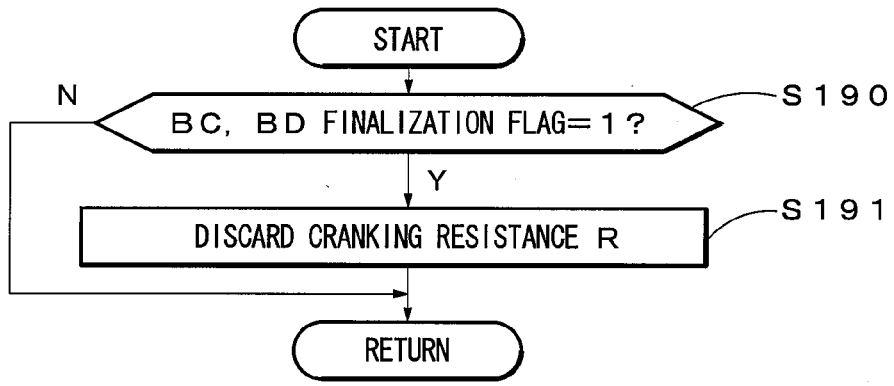
F I G. 22

SECONDARY BATTERY STATE DETECTING APPARATUS AND SECONDARY BATTERY STATE DETECTING METHOD

CROSS REFERENCE TO RELATED APPLICATIONS

This is a continuation application of International Patent Application No. PCT/JP2011/079813 filed Dec. 22, 2011, which claims the benefit of Japanese Patent Application Nos. 2011-001074 and 2011-040144, filed Jan. 6, 2011 and Feb. 25, 2011, respectively, the full contents of all of which are hereby incorporated by reference herein in their entirety.

BACKGROUND OF INVENTION

1. Field of the Invention

The present invention relates to a secondary battery state detecting apparatus and a secondary battery state detecting method.

2. Background of the Invention

In recent years, automobiles or the like tends to have an increased number of electric devices operated with an electric power accumulated in a secondary battery, and devices associated with the safety in running, such as an electric steering and an electric brake, also tend to be driven by the secondary battery. Accordingly, there is an increasing need in accurately knowing a state of charge (e.g., SOC: State of Charge) of the secondary battery.

In general, when the secondary battery is stable, there is a proportional relationship between its open circuit voltage (OCV) and the state of charge. Accordingly, the state of charge can be estimated by detecting the open circuit voltage. However, in a case of a vehicle such as an automobile, at the time of start-up of an engine, since there is an electric power supply from the secondary battery to each load and also an electric power supply from the alternator to the secondary battery, charging and discharging occur repeatedly. In a rechargeable battery after charging and discharging, the proportional relationship between the open circuit voltage and the state of charge does not hold, since the rechargeable battery is affected by generating and disappearing reactions of ions at a surface of a battery plate by an electrochemical reaction and movement of ions by diffusion or convection of an electrolyte.

Japanese Laid-Open Patent Application Nos. 2009-2691 and 2009-300209 disclose techniques in which an open circuit voltage and a state of charge are accurately estimated even after charging and discharging.

As for an automobile or the like, when the starting up of an engine has become difficult due to an insufficient capacity of the secondary battery, a so-called "jump start" may be carried out as an emergency measures by directly connecting terminals of a secondary battery of a disabled vehicle to terminals of a second battery of a rescue vehicle with a cable, and starting up the engine with a power supplied by the rescue vehicle.

When such a jump start is carried out, since the terminals are connected to each other and an electric current bypasses a current sensor, for example, with the techniques disclosed in Japanese Laid-Open Patent Application Nos. 2009-2691 and 2009-300209, influences by polarization and/or stratification cannot be estimated accurately. Therefore, there is a problem that an estimated open circuit voltage and state of charge include errors. Also, other than the jump start, there may be a case where, for example, a secondary battery is charged by directly connecting a charger to the secondary battery, and in such a case, there is also a problem that the estimated open circuit voltage and/or the state of charge include errors.

On a disabled vehicle side, "blind charging" occurs in which the secondary battery is charged without passing through a current sensor, and on a rescue vehicle side, "blind discharging" occurs in which the secondary battery is discharged without passing through a current sensor. When such blind charging or blind discharging has occurred, an influence by polarization and/or stratification cannot be estimated accurately with the techniques disclosed in Japanese Laid-Open Patent Application Nos. 2009-2691 and 2009-300209. Therefore, the estimated open circuit voltage and state of charge include errors. Therefore, it is necessary to detect occurrences of blind charging and blind discharging and to perform correction for each of them. However, a technique for detecting blind charging and blind discharging did not exist in the related art.

Therefore, an object of the present invention is to provide a secondary battery state detecting apparatus and a secondary battery state detecting method that can accurately detect the state of the secondary battery and also detect an occurrence of blind charging and blind discharging, even if an irregular charging-discharging that bypasses a current sensor has been carried out.

SUMMARY OF INVENTION

In order to solve the aforementioned problem, according to an aspect of the invention, a secondary battery state detecting apparatus for detecting a state of a secondary battery installed in a vehicle, includes a current detecting unit that detects an electric current flowing to the secondary battery, a voltage detecting unit that detects a voltage of the secondary battery, and a determining unit that determines, in a case where an external device is directly connected to terminals of the secondary battery and the secondary battery is charged or discharged without passing through the current detecting unit, whether or not an irregular charging-discharging has occurred, in accordance with a change in a current value and a voltage value detected by the current detecting unit and the voltage detecting unit.

With such a configuration, a state of the secondary battery can be detected accurately and an occurrence of blind charging and blind discharging can be detected.

According to another aspect, in addition to the aforementioned aspect, the determining unit determines, in a case where the secondary batteries of the vehicle and another vehicle are connected to each other via a cable in order to rescue an exhausted state of the secondary battery of the vehicle or the other vehicle, whether a blind charging or a blind discharging has occurred in the secondary battery of the vehicle, in accordance with a relationship between a change in the current value and a change in the voltage value detected by the current detecting unit and the voltage detecting unit, the blind charging being an irregular charging in which charging is performed without passing through the current detecting unit, the blind discharging being an irregular discharging in which discharging is performed without passing through the current detecting unit has occurred.

With such a configuration, an occurrence of blind charging and blind discharging can be detected.

According to yet another aspect, in addition to the aforementioned aspect, the secondary battery state detecting apparatus further includes a state detection unit that detects a state of the secondary battery by referring to the current value and the voltage value detected by the current detecting unit and the voltage detecting unit as well as a determination result of the determining unit.

With such a configuration, a state of the secondary battery can be detected accurately by taking an irregular charging-discharging into consideration.

According to still another aspect, in addition to the aforementioned aspect, in a case where the determining unit has determined that the irregular charging-discharging has occurred, the state detection unit discards an impedance value of the secondary battery which was measured when the irregular charging-discharging has occurred.

With such a configuration, a false state detection can be prevented by discarding an impedance of the secondary battery including an error.

According to still another aspect, in addition to the aforementioned aspect, in a case where the determining unit has determined that the irregular charging-discharging has occurred, another apparatus is informed of an occurrence of the irregular charging-discharging.

With such a configuration, by informing the other apparatus of an occurrence of irregular charging-discharging, it is possible to let the other apparatus know that it is in a special situation.

According to still another aspect, in addition to the aforementioned aspect, the determining unit determines blind charging or blind discharging depending on whether a value obtained by $\Delta V - \Delta I \times Z$ is positive or negative, where $\Delta I$ is a change in an electric current detected by the current detection unit, $\Delta V$ is a change in a voltage detected by the voltage detecting unit, and $Z$ is an internal resistance of the secondary battery.

With such a configuration, an occurrence of blind charging and blind discharging can be detected accurately.

According to still another aspect, in addition to the aforementioned aspect, the determining unit has thresholds each corresponding to a positive value or a negative value obtained by $\Delta V - \Delta I \times Z$, and determines whether blind charging or blind discharging has occurred in accordance with a comparison with the thresholds.

With such a configuration, occurrence of blind charging and blind discharging can be detected accurately without being influenced by noise or the like.

According to another aspect, in addition to the aforementioned aspect, the determining unit is operable, when the value obtained by $\Delta V - \Delta I \times Z$ has exceeded the positive or negative threshold, to fix previously measured voltage and current values as reference values among voltage values and current values on which determination have been performed and to obtain $\Delta V$ and $\Delta I$ based on the reference values and latest voltage and current values, and is operable, when the value obtained by $\Delta V - \Delta I \times Z$ has been continuously exceeding the positive or negative threshold for a certain period, to determine that the blind charging or the blind discharging has occurred.

With such a configuration, an occurrence of blind charging and blind discharging can be detected accurately without being influenced by noise or the like.

According to yet another aspect, in addition to the aforementioned aspect, the determining unit performs the determination of the blind charging only in a case where the engine of the vehicle has been stopped.

With such a configuration, since the battery is not exhausted while the engine is operating, a load of the process can be reduced by stopping the determination and thus a false determination can be prevented.

According to yet another aspect, in addition to the aforementioned aspect, the determining unit does not perform the determination of blind discharging until an engine of the vehicle is stopped, in a case where it is determined that blind charging has occurred.

With such a configuration, since it is very rare that a vehicle having an exhausted battery performs a jump start on another vehicle after being subjected to a jump start, a load of the process can be reduced and a false determination can be prevented by stopping such a determination.

According to yet another aspect, in addition to the aforementioned aspect, the determining unit corrects, even in a case where it is determined that the blind discharging has occurred, the determination such that the blind charging has occurred in a case where the voltage has risen as compared to the case before the change.

With such a configuration, in a case where the vehicle is the disabled vehicle, when the secondary batteries are connected to each other while the other vehicle is at rest and the engine is started, even if it is falsely determined that a blind discharging has occurred by a temporarily flowing current, the determination can be corrected.

According to yet another aspect, in addition to the aforementioned aspect, further provided is a state detecting unit that estimates a state of the secondary battery in consideration of an amount of change of a polarization phenomenon or a stratification phenomenon caused by blind charging or blind discharging.

With such a configuration, in a case where blind charging or blind discharging has occurred, a state of the secondary battery can be accurately estimated by taking the amount of change of a polarization phenomenon or a stratification phenomenon into account.

According to yet another aspect, a secondary battery state detecting method of detecting a state of the secondary battery installed in a vehicle by referring to detection results of a current detecting unit and a voltage detecting unit, includes determining, in a case where an external device is directly connected to terminals of the secondary battery and the secondary battery is charged or discharged without passing through the current detecting unit, whether or not an irregular charging-discharging has occurred, in accordance with a change in the current value and the voltage value detected by the current detecting unit and the voltage detecting unit.

With such a method, a state of the secondary battery can be detected accurately and also an occurrence of blind charging and blind discharging can be detected.

According to an aspect of the invention, it is possible to provide a secondary battery state detecting apparatus and a secondary battery state detecting method which can detect the state of the secondary battery accurately and can detect occurrences of blind charging and blind discharging, even if an irregular charging-discharging that bypasses the current sensor is carried out.

BRIEF DESCRIPTION OF DRAWINGS

FIG. 4 is a diagram illustrating a relationship between stratification and charge polarization, and the actual capacity.

FIG. 5 is a graph illustrating a change in voltage while the vehicle is running and at rest.

FIG. 7 is a diagram for explaining an operational principle of the flowchart shown in FIG. 6.

FIG. 8 is a diagram for explaining an operational principle of the flowchart shown in FIG. 6.

FIG. 10 is a diagram illustrating a voltage change while running and while at rest.

FIG. 14 is a graph illustrating a change in the voltage and the current in a case where blind charging has occurred.

FIG. 16 is a graph illustrating a change in the voltage and the current in a case where blind discharging has occurred.

FIG. 17 is a graph illustrating a change in the voltage and the current in a case where the secondary batteries of the disabled vehicle and the rescue vehicle are connected by the connection cable in a state where the engine of the rescue vehicle is stopped.

FIG. 18 is a flowchart for correcting the determination in a case where blind charging is falsely determined as a blind discharging.

FIG. 19 is a diagram illustrating a change in the voltage and the current of the disabled vehicle in a case where an engine of the rescue vehicle is started up with the secondary batteries of the disabled vehicle and the rescue vehicle being connected by the connection cable in a state where the engine of the rescue vehicle is stopped.

FIG. 20 is a flowchart for determining a polarization correction coefficient and stratification correction coefficient in a case where blind charging has occurred.

FIG. 21 is a flowchart for determining the polarization correction coefficient in a case where blind discharging has occurred.

FIG. 22 is a flowchart for discarding a cranking resistance in a case where blind charging or blind discharging has occurred.

DETAILED DESCRIPTION

Hereinafter, embodiments of the present invention will be described.

(A) Explanation of Configuration of Present Embodiment

Figure 1:
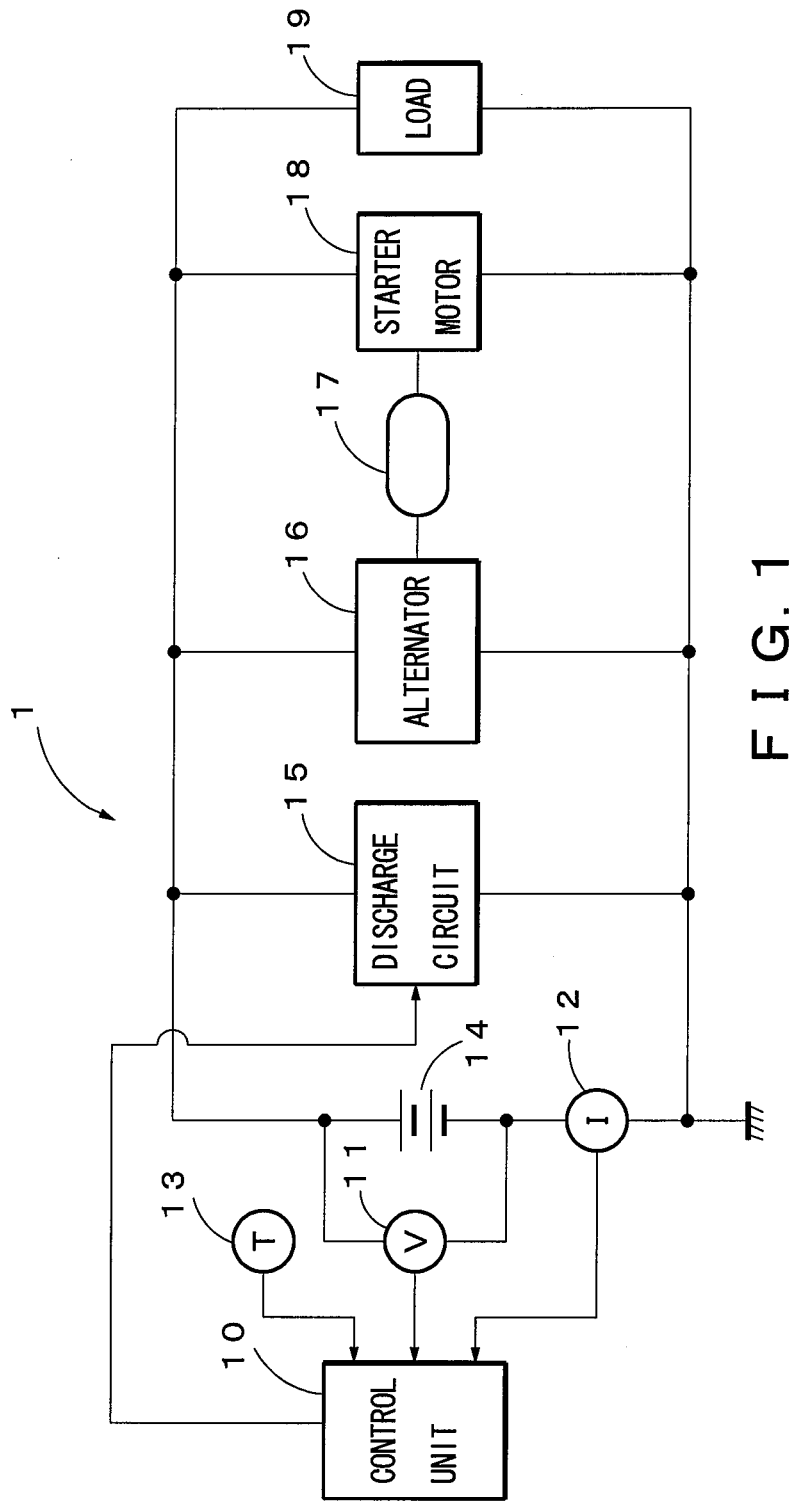
FIG. 1 is a diagram illustrating an exemplary configuration of a secondary battery state detecting apparatus of an embodiment of the present invention.

FIG. 1 is a diagram illustrating a power supply system of a vehicle having a secondary battery state detecting apparatus of an embodiment of the present invention. In this figure, the secondary battery state detecting apparatus 1 includes, as its main constituent elements, a control unit 10, a voltage sensor 11, a current sensor 12, a temperature sensor 13, and a discharging circuit 15, and detects a state of the secondary battery 14. The control unit 10 detects a state of the secondary battery 14 based on outputs from the voltage sensor 11, the current sensor 12, and the temperature sensor 13, respectively. The voltage sensor 11 detects a terminal voltage of the secondary battery 14 and informs the control unit 10 of the terminal voltage. The current sensor 12 detects a current flowing to the secondary battery 14 and informs the control unit 10 of the current. The temperature sensor 13 detects a temperature of the secondary battery 14 itself or an environmental temperature of surroundings, and informs the control unit 10. The discharging circuit 15 includes, for example, a semiconductor switch, a resistive element, etc., that are connected in series, and by performing an ON/OFF control of the semiconductor switch by the control unit 10, the secondary battery 14 is caused to discharge intermittently.

The secondary battery 14 is, for example, a so-called flooded lead-acid battery in which lead dioxide is used as a positive electrode (cathode plate), sponge-like lead is used as a negative electrode (anode plate) and dilute sulfuric acid is used as an electrolyte. The secondary battery 14 is charged by an alternator 16, starts up an engine by driving a starter motor 18, and supplies power to a load 19. The alternator 16 is driven by an engine 17, generates an alternating current power, converts the alternating current power into a direct current power with a rectifying circuit, and charges the secondary battery 14.

The engine 17 is constituted by, for example, a reciprocating engine such as a gasoline engine and a diesel engine or a rotary engine, and is started up by the starter motor 18, applies a propulsion force to the vehicle by driving a propulsion driving wheel via a transmission, and generates power by driving the alternator 16. The starter motor 18 is, for example, a direct current electric motor, generates a rotational force by the power supplied from the secondary battery 14, and starts up the engine 17. The load 19 may be, for example, an electric steering motor, a defogger, an ignition coil, a car audio system, a car navigation system and the like, and operates by an electric power from the secondary battery 14.

Figure 2:
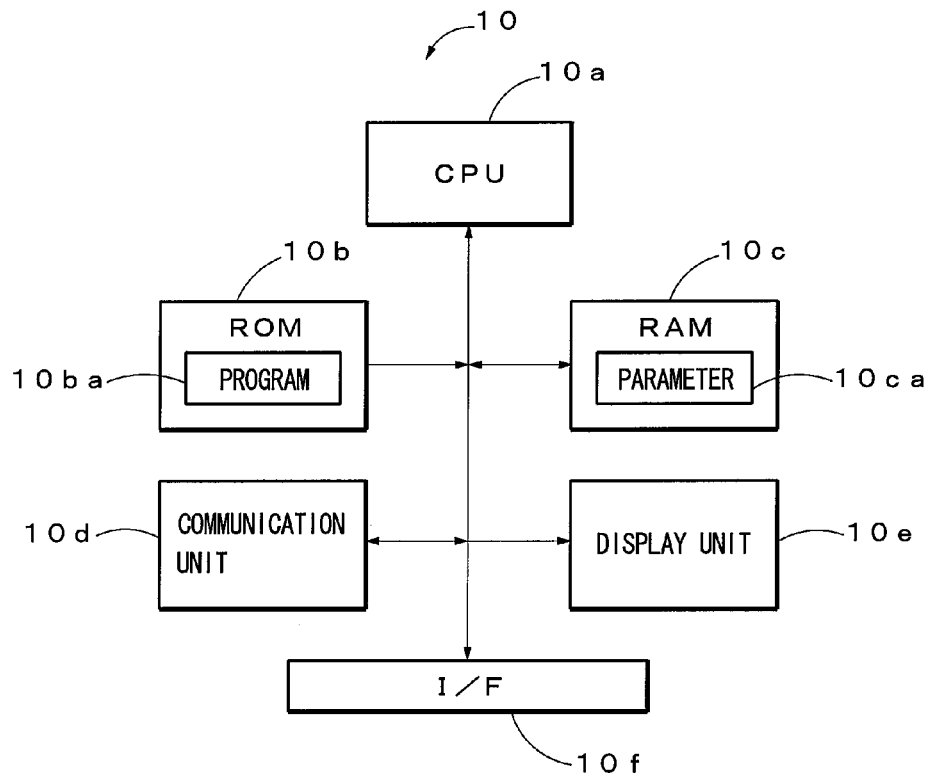
FIG. 2 is a block diagram illustrating an exemplary configuration of details of a control unit of FIG. 1.

FIG. 2 is a diagram illustrating a detailed exemplary configuration of the control unit 10 shown in FIG. 1. As shown in the figure, the control unit 10 has a CPU (Central Processing Unit) 10a, a ROM (Read Only Memory) 10b, a RAM (Random Access Memory) 10c, a communication unit 10d, a display unit 10e and an I/F (Interface) 10f. The CPU 10a controls each unit based on a program 10ba stored in the ROM 10b. The ROM 10b may be a semiconductor memory or the like and stores the program 10ba, etc. The RAM 10c may be a semiconductor memory or the like and stores a parameter 10ca which is generated when the program 10ba is executed. The communication unit 10d is connected to other devices (e.g., an ECU (Engine Control Unit), not shown) via a communication line, and sends and receives information to and from the other devices. The display unit 10e may be, for example, a liquid crystal display or the like, that displays information supplied from the CPU 10a. The I/F 10f converts signals supplied from the voltage sensor 11, the current sensor 12 and the temperature sensor 13 into digital signals and takes them in, and also supplies a driving current to the discharging circuit 15 and controls it.

(B) Explanation of Overview of Operation of the Embodiment

Next, referring to FIGS. 3 to 5, an overview of an operation of the embodiment will be described. In the following, a polarization phenomenon and a stratification phenomenon of the secondary battery will be described and then an overview of the operation of the present embodiment will be described. First, an explanation of the polarization phenomenon will be made. The polarization phenomenon includes charge polarization which occurs during charging and discharge polarization which occurs during discharging. Here, a charge polarization phenomenon means a phenomenon in which an output voltage of the secondary battery 14 is increased as a result of an increase in ion density at an electrode surface due to a delay of an electrochemical reaction at the electrode surface of the secondary battery 14 during charging. A discharge polarization phenomenon is a phenomenon in which an output voltage of the secondary battery 14 is decreased due to a decrease in ion density at an electrode surface during discharging.

On the other hand, the stratification phenomenon is a phenomenon in which an output voltage changes due to a difference in specific gravity between an upper portion and a lower portion of the electrolyte, which difference being produced during discharging or during charging. Specifically, in the secondary battery, since an upper portion in a vertical direction of the electrode is preferentially discharged at the beginning of discharge, the specific gravity of the upper portion of the electrolyte becomes lower than that of the lower portion. Next, during charging, since lead sulfate produced during discharging changes into metallic lead and sulfuric acid, a high-concentration sulfuric acid is released into the electrolyte. Therefore, the released sulfuric acid settles down to the lower portion and stratification occur in which a difference in gravity is produced between the upper portion and the lower portion of the electrolyte.

Figure 3:
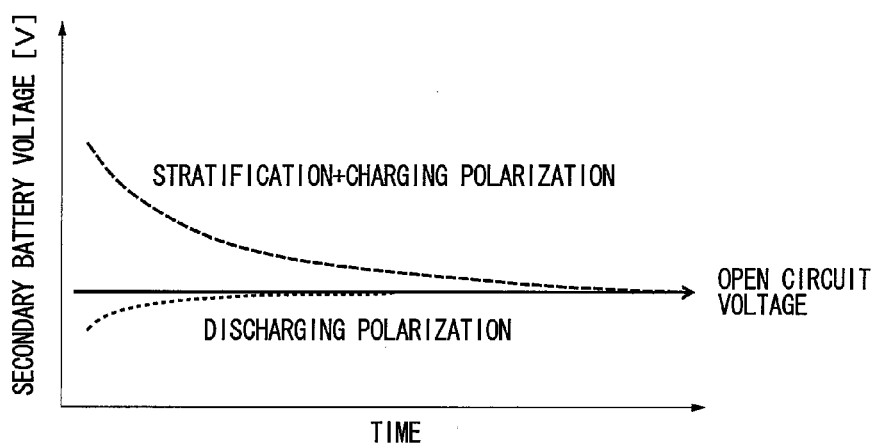
FIG. 3 is a diagram illustrating a change in a voltage of the secondary battery due to an influence by stratification and polarization.

FIG. 3 is a graph indicating a relationship between the polarization and stratification phenomena and the voltage. As shown in FIG. 3, the stratification phenomenon and the charge polarization phenomenon have an influence that tends to increase the voltage of the secondary battery 14 to a voltage higher than the open circuit voltage, and such an influence reduces with time. The discharge polarization phenomenon has an influence that tends to decrease the voltage of the secondary battery 14 to a voltage lower than the open circuit voltage, and such an influence decreases with time.

FIG. 4 is a diagram illustrating a relationship between the open circuit voltage, and the stratification and the charge polarization. As can been seen on the left hand side in FIG. 4, a voltage which is measured as an apparent voltage of the secondary battery 14 includes an amount of increase in voltage due to the stratification and the charge polarization. As has been described above, the amount of increase in voltage due to the stratification and the charge polarization decrease with time and after a predetermined time has elapsed, as shown on the right hand side of FIG. 4, a portion of the stratification and the charge polarization is decreased as compared to the portion in the diagram on the left hand side of FIG. 4.

FIG. 5 is a graph indicating a voltage change of the secondary battery 14 while running and while the vehicle is at rest. In FIG. 5, while running, the voltage of the secondary battery 14 remains at about 14V, and while at rest, the voltage decreases with time and approaches the open circuit voltage.

Here, the voltage change due to stratification and polarization is merely an increase in an apparent voltage and irrelevant to a dischargeable capacity of the secondary battery 14. Therefore, if the open circuit voltage and the charging rate of the secondary battery 14 are determined based on an apparent voltage including stratification and charge polarization, a value greater than the actual open circuit voltage or charging rate will be obtained. Accordingly, in the related art, in order to eliminate an influence due to stratification and polarization and to obtain an accurate open circuit voltage and charging rate, it is known to estimate the amount of polarization and the amount of stratification based on an integration value of charge/discharge currents flowing into/out of the secondary battery 14, and to determine an open circuit voltage indicating the actual capacity in FIG. 4 based on the estimated amount of polarization and amount of stratification. A detailed method thereof is described, for example, in documents such as Japanese Laid-Open Patent Application No. 2009-300209.

If the secondary battery 14 is exhausted (in a case where an amount of charge has decreased and cannot start up the engine), there may be a case where a so-called "jump start" is performed, in which a secondary battery of another vehicle and the secondary battery 14 of the disabled vehicle are directly connected via a connection cable and the engine 17 is started up by receiving a power supply from the secondary battery of the other vehicle. With such a jump start, since the terminals of the secondary battery are directly connected to each other via a cable, an electric current flowing between the two secondary batteries is not detected by the current sensor 12. Therefore, due to an error produced in the integrated values of the charge/discharge current flowing into/out of the aforementioned secondary battery 14, estimated values of the amount of polarization and the amount of stratification will contain errors. As a result, values higher than the actual open circuit voltage or the actual charging rate will be estimated, and when the secondary battery 14 is used believing that there is a sufficient amount of charge, there may be a case where the battery becomes exhausted or the engine 17 cannot be restarted.

According to the first embodiment of the present invention, as described later, whether or not a jump start has been carried out is detected based on a change in the current flowing to the secondary battery 14 and a change in the voltage. In a case where a jump start is detected, a jump start occurrence flag is set and other devices (e.g., ECU, not shown) connected to the communication unit 10d of the secondary battery state detecting apparatus 1 is informed of an occurrence of the jump start. Also, values of correction coefficients for eliminating the influences by stratification and polarization based on an open circuit voltage OCV1 obtained by current integration and OCV2 obtained from voltage transition are adjusted. Further, an internal resistance of the secondary battery 14 obtained at the time of jump start is discarded since it is not correct because supplying and receiving of the current is performed with another secondary battery. With such a process, in a case where the jump start is performed, another device is informed of an occurrence of the jump start, and, for example, power consumption can be suppressed with an operation in an operation mode which is different from the normal mode (power consumption being suppressed). Also, by adjusting a value of the correction coefficient for eliminating the influences due to stratification and polarization, it is possible to know the actual capacity accurately. Further, by discarding the internal resistance of the secondary battery 14, it is possible to prevent a false decision based on incorrect parameters.

Figure 12:
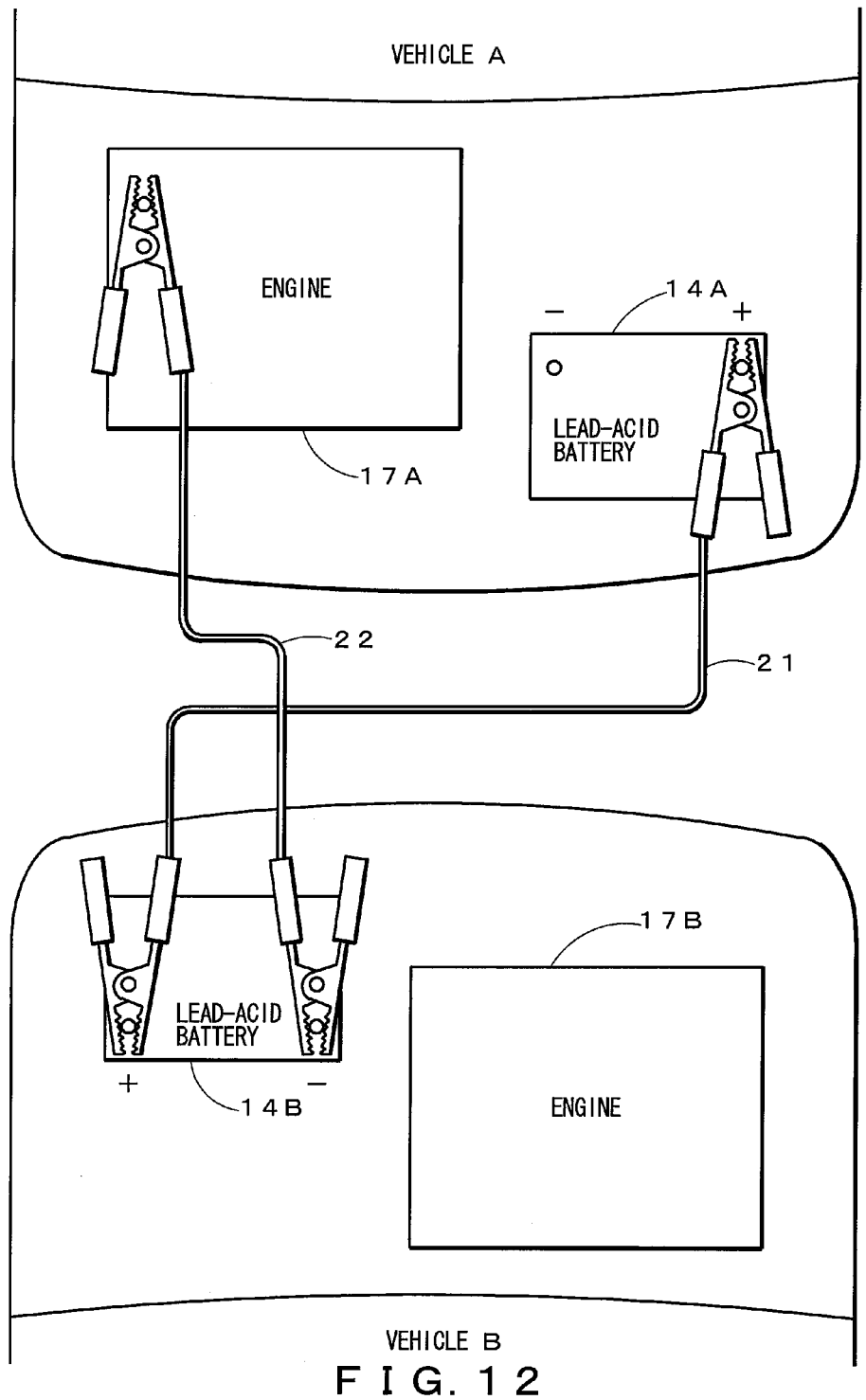
FIG. 12 is a diagram illustrating a state where secondary batteries of a disabled vehicle and a rescue vehicle are connected to each other with a connection cable.

Also, on the disabled vehicle-side, "blind charging" occurs, which is charging that is not detected by the current sensor 12, whereas, on the rescue vehicle-side, "blind discharging" occurs which is discharging that is not detected by the current sensor 12. It is to be noted that even if a jump start is carried out, there may be a case where blind charging or blind discharging does not occur. For example, as shown in FIG. 12, in a case where the jump start is performed between a vehicle A and a vehicle B, the connection cable 21 is connected between a positive terminal of the secondary battery 14A of the vehicle A and a positive terminal of the secondary battery 14B of the vehicle B, and a connection cable 22 is connected between an engine 17A (a body) of the vehicle A and a negative terminal of the secondary battery 14B of the vehicle B. In a case where the vehicle A is configured in a manner shown in FIG. 1 and the current sensor 12A is disposed between the secondary battery 14A and the body, an electric current communicated with the vehicle B flows through the current sensor 12. Accordingly, no matter whether the vehicle A is the disabled vehicle or the rescue vehicle, neither blind charging nor blind discharging occurs. On the other hand, with the vehicle B, an electric current used for communication with the vehicle A does not flow through the current sensor 12. Therefore, in a case where the vehicle B is the disabled vehicle, a blind charging occurs and in the case of a rescue vehicle, a blind discharging occurs. However, recently, since there are cases where a cover made of resin is attached to the engine 17 to reduce an engine noise, it is more often connected in a manner indicated as the vehicle B and there is an increased chance of occurrence of the blind charging or the blind discharging.

In a case where a blind charging has occurred, there will be an error produced in an integrated value of the charge/discharge current flowing to the aforementioned secondary battery 14 and thus the estimated values of the amount of polarization and the amount of stratification will also contain errors. As a result, the estimated values will be higher than the actual open circuit voltage or the actual charging rate, and if the secondary battery 14 is used believing that there is a plenty of charge amount, there may be a case where the battery is exhausted and the engine 17 cannot be restarted. Further, in a case where blind discharging has occurred, although an influence due to the amount of polarization and the amount of stratification is less than that of the case of blind charging, since a power is supplied to the disabled vehicle, the charging rate will decrease and there may be a case where the battery becomes exhausted.

Therefore, according to the second embodiment of the present invention, as will be described later, whether or not blind charging or blind discharging has occurred is detected based on a change in the current flowing to the secondary battery 14 and the voltage. In a case where it is determined that these have occurred, a flag is set and other devices (e.g., ECU, not shown) connected to the communication unit 10d of the secondary battery state detecting apparatus 1 are informed of the occurrences. Also, values of correction coefficients for eliminating the influences by stratification and polarization based on an open circuit voltage OCV1 obtained by current integration and OCV2 obtained from voltage transition are adjusted for blind charging and for blind discharging. Further, an internal resistance of the secondary battery 14 obtained at the time of jump start is discarded since it is not correct because supplying and receiving of the current is performed with another secondary battery. With such a process, in a case where the blind charging or blind discharging is performed, another device is informed of an occurrence of the jump start, and, for example, power consumption can be suppressed with an operation in an operation mode which is different from the normal mode (power consumption being suppressed). Also, by adjusting a value of the correction coefficient for eliminating the influences due to stratification and polarization, it is possible to know the actual capacity accurately. Further, by discarding the internal resistance of the secondary battery 14, it is possible to prevent a false decision based on incorrect parameters.

(C) Explanation of Detailed Operation of First Embodiment

Figure 6:
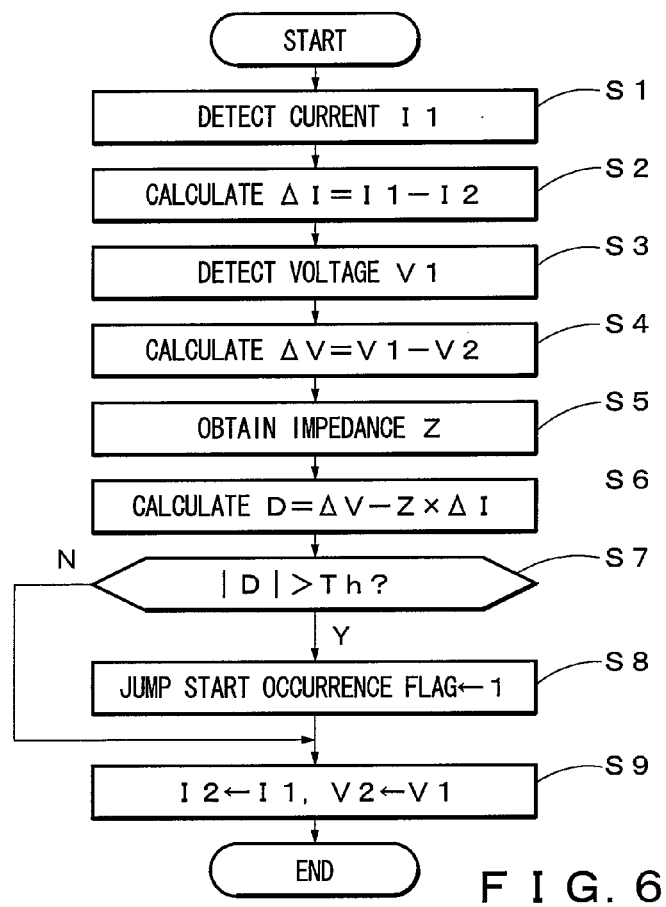
FIG. 6 is a flowchart for explaining an exemplary process of determining whether there is a jump start.

Now, referring to FIGS. 6 to 11, a detailed operation of the present embodiment will be described in detail. FIG. 6 is a flowchart for explaining a process flow executed in the control unit 10 shown in FIG. 2, in order to detect whether an irregular charging-discharging such as a jump start has been carried out. It is to be noted that the process shown in FIG. 6 is performed with, for example, a 10 ms cycle during the running of the vehicle where there is a drastic change in the electric current and the voltage, and performed with, for example, a 1 s cycle during the stoppage where the change in the electric current and the voltage is moderate. When the flow shown in the flow chart of FIG. 6 is started, the following steps are performed.

In step S1, the CPU 10a refers to an output of the current sensor 12 and obtains the current value I1 at this point.

In step S2, the CPU 10a acquires a current value I2 obtained in the previous process (and stored in the RAM 10c by a process at step S9 described below) from the parameter 10ca in the RAM 10c, and calculates a difference $\Delta I$ $(=I1-I2)$ between the current value I2 and the current value I1 obtained in step S1.

In step S3, the CPU 10a refers to an output of the voltage sensor 11 and acquires the voltage value V1 at this point.

In step S4, the CPU 10a acquires the voltage value V2 obtained in the previous process from the parameter 10ca in the RAM 10c, and calculates a difference $\Delta V$ $(=V1-V2)$ between the voltage value V2 and the voltage value V1 acquired in step S3.

In step S5, the CPU 10a acquired a static impedance Z measured during stoppage of the vehicle and stored in the RAM 10c as the parameter 10ca. Here, the static impedance Z means an internal impedance of the secondary battery 14 measured when the secondary battery 14 is in an electric equilibrium state. This static impedance is measured by performing a pulse discharging during the stoppage of the vehicle at a predetermined cycle by the discharging circuit 15 and measuring the change of the current and the voltage at this time. A cranking resistance, which will be described later, is a resistance obtained from an electric current and a voltage which are detected when the engine 17 is started up by the starter motor 18 (when a large current is flowing) and, to the contrary to the static impedance, the cranking resistance is referred to as a dynamic impedance.

In step S6, the CPU 10a determines D in accordance with the following equation (1).

$$D = \Delta V - Z \times \Delta I \qquad (1)$$

Here, $\Delta V = Z \times \Delta I$ ($\Delta V - Z \times \Delta I = 0$) is satisfied during normal time, since Ohm's Law holds between the voltage V and the current I of the secondary battery 14 and the impedance Z. However, in a case where a jump start is performed, although the current I is not detected on the disabled vehicle side, the voltage rises due to a current supply from the rescue vehicle. As a result, on the disabled vehicle side, as shown in FIG. 7, the value of D becomes positive. In an example of FIG. 7, a horizontal axis represents time and a vertical axis represents the voltage and the current. A jump start is performed (the secondary batteries are connected with each other via a cable) at a central portion of the graph, and at this time, temporarily becomes $\Delta V - Z \times \Delta I > 0$. Whereas, on the rescue vehicle side, the voltage drops since an electric current is supplied to the disabled vehicle side even though the current I is not detected. As a result, as shown in FIG. 8, the value of D becomes negative on the rescue vehicle side. In the example of FIG. 8, a jump start is performed (the secondary batteries are connected to each other via a cable) at the central portion in the figure, and temporarily becomes $\Delta V - Z \times \Delta I < 0$.

In step S7, the CPU 10a determines whether or not an absolute value of D, |D|, obtained in step S6 is greater than a threshold Th, and if |D|>Th holds (step S7: Yes), proceeds to step S8, and if not (step S7: No), proceeds to step S9. Here, the threshold Th may be a value that can detect a change in $\Delta V - Z \times \Delta I$ shown in FIGS. 7 and 8 and also a value that is not affected by the noise due to voltage or current change.

In step S8, the CPU 10a sets the jump start occurrence flag to "1", which indicates that a jump start has occurred. It is to be noted that since the jump start occurrence flag can be looked up from other devices (e.g., the load 19 and ECU (not shown)) connected to the communication unit 10d of the secondary battery state detecting apparatus 1 shown in FIG. 1, the other devices can suppress power consumption by being operated with an operation mode different from a normal mode (power consumption is suppressed).

In step S9, the CPU 10a substitutes the current I1 and the voltage V1 detected in steps S1 and S3 into variables I2 and V2 holding the previous values, respectively. As a result, these values are stored in the parameter 10ca of the RAM 10c and used as I2 and V2 in the subsequent process.

With the aforementioned process, occurrence of the jump start can be detected on both the disabled vehicle side and the rescue vehicle side.

Figure 9:
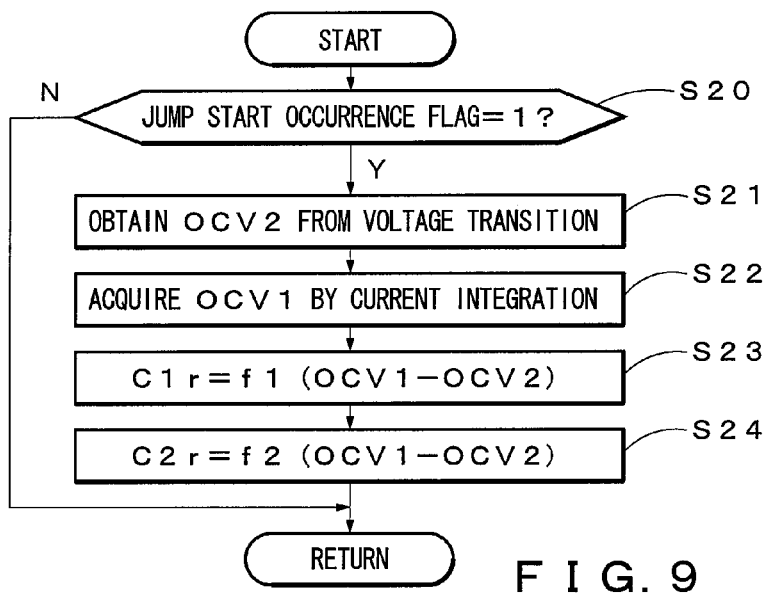
FIG. 9 is a flowchart for explaining an exemplary process of obtaining a polarization correction coefficient and a stratification correction coefficient.

Now, referring to FIG. 9, a process of adjusting the values of the correction coefficients for eliminating the influence of the stratification and the polarization will be described. The process of FIG. 9 is, for example, a process carried out at a predetermined cycle. When the process of this flowchart is started, the following steps are performed.

In step S20, the CPU 10a determines whether or not the jump start occurrence flag is "1". If it is "1" (step S20: Yes), proceeds to step S21, and if not (step S20: No), terminates the process. For example, in a case where a jump start is performed at time t2 shown in FIG. 10, since the jump flag will be set at a state "1" in the process of step S8 in FIG. 6, it is determined as Yes in step S20 and the process proceeds to step S21.

In step S21, the CPU 10a obtains the open circuit voltage OCV2 from voltage transition. Specifically, as shown in FIG. 5, when the engine 17 is stopped, the voltage of the secondary battery 14 gradually drops with an elapse of time, and approaches the open circuit voltage. At this time, it is known that a certain correlation exists between a rate of change of the voltage m and a difference in voltage with respect to the open circuit voltage dV at a certain time. Accordingly, a table or an equation that quantifies such a correlation is stored in the RAM 10c, and by looking up the table or the like based on the voltage V and the rate of change m of the secondary battery 14 at a certain time, OCV2 can be obtained from voltage transition. In an example of FIG. 10, OCV2 after the engine 17 has been stopped at time t3 changes as indicated with a broken line.

In step S22, the CPU 10a obtains a final update value of the open circuit voltage OCV1 determined by current integration and stored in the RAM 10c as the parameter 10ca. Here, current integration is a method of determining the charging rate of the secondary battery 14 by always measuring the current value discharged from or charged to the secondary battery 14, and integrating the current measurement values. Since a substantially linear relationship exists between the open circuit voltage OCV1 and the charging rate SOC1, the open circuit voltage OCV1 can be determined from the charging rate SOC1 based on such a relationship. The calculation of the open circuit voltage OCV1 and the charging rate SOC1 based on current integration is performed at a predetermined time interval, and the determined open circuit voltage OCV1 and the charging rate SOC1 are stored in the RAM 10c by overwriting the parameter 10ca. In an example of FIG. 10, the open circuit voltage OCV1 is acquired which was stored last at the time the engine 17 was stopped at time t3.

In step S23, the CPU 10a applies a difference (OCV1−OCV2) between the open circuit voltage OCV1 and the open circuit voltage OCV2 to a function f1( ) for determining a polarization correction coefficient C1r, and determines the polarization correction coefficient C1r. Here, the polarization correction coefficient C1r is a coefficient for correcting the amount of polarization C1, which the control unit 10 possesses as an estimate value, for eliminating an error by polarization in accordance with detection of a jump start. Specifically, when a jump start is detected, for example, it is expressed as C1←C1−C1r ("←" indicates substitution into a value of the variable) and the amount of polarization C1 is corrected.

The open circuit voltage OCV1 is determined by current integration. Therefore, in a case where a jump start is performed, since an electric current that flows to and from the other secondary battery cannot be detected with the current sensor 12, an electric current which is flowing at this time is not reflected into the open circuit voltage OCV1. On the other hand, the open circuit voltage OCV2 is determined with a method different from current integration (details will be described later), and in this method, OCV2 is measured with a current flowing to and from the other secondary battery being taken into consideration. Therefore, in a case where the jump start is executed, a value of the difference between them (OCV1−OCV2) is increased as compared to a case where it is not executed. Accordingly, as an exemplary method of achieving a function f1( ) a table in which the value of (OCV1−OCV2) and the polarization correction coefficient C1r are associated is, for example, prepared in advance in the RAM 10c, and by applying the aforementioned value of the difference to the table, the polarization correction coefficient C1r can be obtained.

In step S24, the CPU 10a applies a difference (OCV1−OCV2) between the open circuit voltage OCV1 and the open circuit voltage OCV2 to a function f2 ( ) for determining the stratification correction coefficient C2r, and determines the stratification correction coefficient C2r. Here, the stratification correction coefficient C2r is a coefficient for correcting the amount of stratification C2 that the control unit 10 has as an estimation value for eliminating an error by stratification, based on a detection of a jump start. Specifically, in a case where a jump start is detected, it is for example defined as C2←C2−C2r, and the amount of stratification C2 is corrected. Also, the relationship between the open circuit voltage OCV1 and the open circuit voltage OCV2 is similar to the aforementioned case, and it is also similar to the aforementioned case in that a table indicating an association between the stratification correction coefficient C2r and (OCV1−OCV2) is prepared in advance in the RAM 10c, and in that the stratification correction coefficient C2r can be obtained by a determination based on the table.

With the process described above, the polarization correction coefficient C1r and the stratification correction coefficient C2r are obtained. By using such correction coefficients, even in a case where stratification and polarization have changed due to a jump start, the amount of stratification and the amount of polarization after the change can be obtained by correcting the amount of stratification and the amount of polarization before the change using these correction coefficients.

Figure 11:
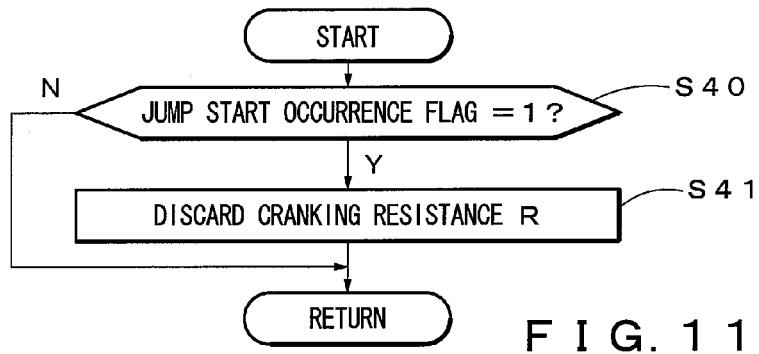
FIG. 11 is the flowchart for explaining an exemplary process of discarding a cranking resistance.

Now, referring to FIG. 11, a process of discarding the cranking resistance R will be described. The process shown in the flowchart of FIG. 11 is, for example, executed with a certain time interval. When the process of FIG. 11 is started, the following steps are executed.

In step S40, the CPU 10a determines whether or not the jump start occurrence flag is "1", and if it is "1" (step S40: Yes), proceeds to step S41, and if not (step S40: No), terminates the process.

In step S41, the CPU 10a discards the cranking resistance R measured during cranking (rotationally drive the engine 17 by the starter motor 18) at the time of jump start and stored in the RAM 10c as the parameter 10ca. Here, the cranking resistance R is a real component of impedance obtained from an electric current flowing from the secondary battery 14 to the starter motor 18 when the engine 17 is rotationally driven by the starter motor 18 and the terminal voltage of the secondary battery 14. In other words, during the cranking at jump start, since the current flows to and from the secondary battery of the other vehicle, the cranking resistance R cannot be obtained accurately and thus such a cranking resistance R is discarded. Therefore, an erroneous determination based on a cranking resistance containing an error can be prevented.

Figure 13:
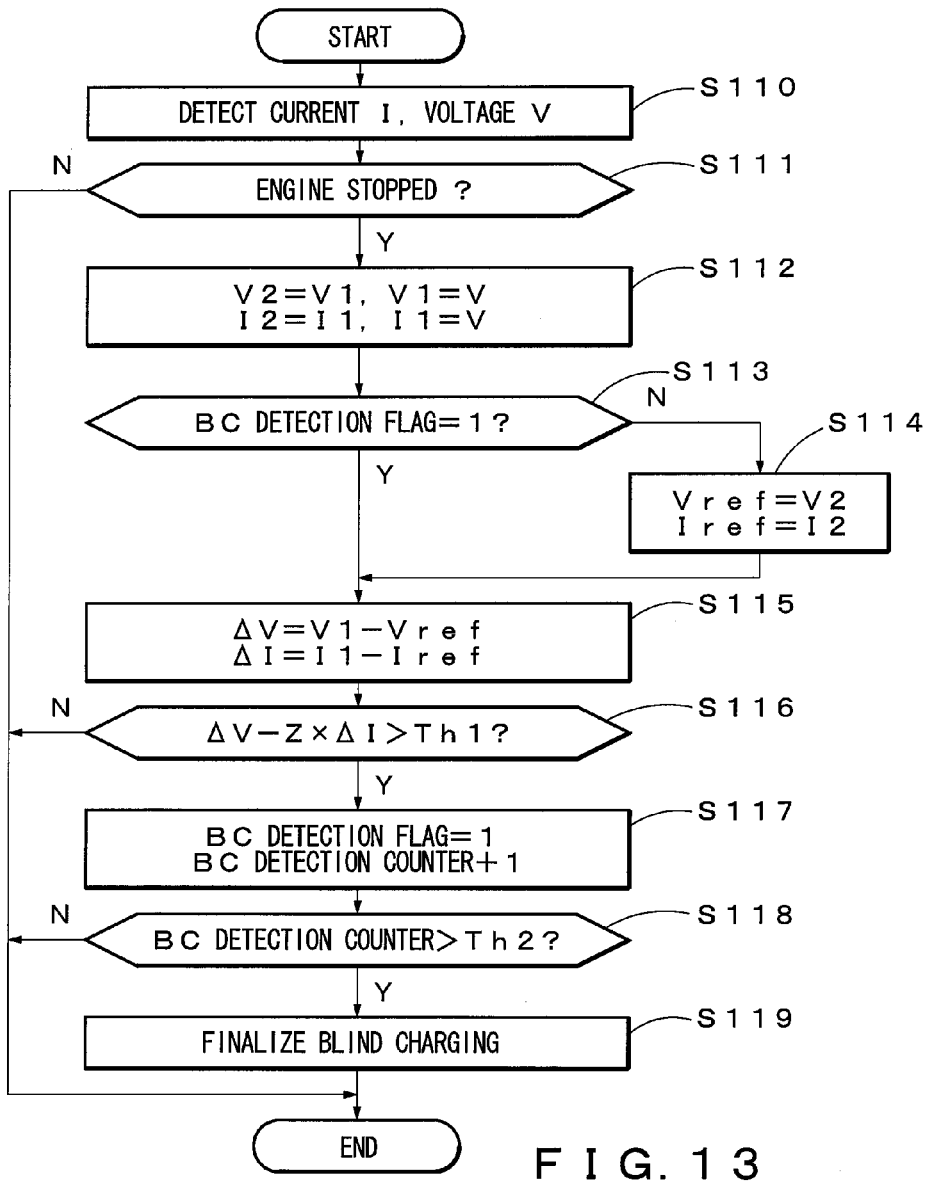
FIG. 13 is a flowchart for detecting blind charging.

(D) Explanation of Detailed Description of Operation of the Second Embodiment Referring now to FIGS. 13 to 21, a detailed operation of the present embodiment will be described. FIG. 13 is a flowchart for explaining a flow of the process executed at the control unit 10 shown in FIG. 2 to detect an occurrence of blind charging due to a jump start. It is to be noted that the process shown in FIG. 13 is, for example, executed at a 10 ms cycle during running of the vehicle where there is a drastic change in the current and the voltage, and for example, executed at a 1 s cycle during stoppage where the change of the current and the voltage is moderate. When the flow illustrated in the flow chart of FIG. 13 is started, the following steps are performed.

In step S110, the CPU 10a refers to outputs of the voltage sensor 11 and the current sensor 12, and detects the voltage value V and the current value I at that instant.

In step S111, the CPU 10a determines whether or not the engine 17 is at rest, and if the engine 17 is at rest (step S111: Yes), proceeds to step S112, and if not (step S111: No), the process terminates. The reason why the process terminates in a case where the engine 17 is operating is that, when the engine 17 is operating, it cannot be assumed that the blind charging occurs with the own vehicle being the disabled vehicle.

In step S112, the CPU 10a substitutes the voltage V1, which is detected in the previous process, into V2, and substitutes the voltage V, which is newly detected in step S110, into V1. Also, the current I1, which is detected in the previous process, is substituted into I2, and the current I, which is newly detected in step S110, is substituted into I1.

In step S113, the CPU 10a determines whether or not a BC (Blind Charge) detection flag indicating an occurrence of blind charging is "1", and if it is "1" (step S113: Yes), proceeds to step S115, and if not (step S113: No), proceeds to step S114. The BC detection flag is a flag which is set to "1" in step S117 if the determination in the below-mentioned process of step S116 is Yes.

In step S114, the CPU 10a substitutes a value of the variable V2 into a variable Vref, and substitutes a value of the variable I2 into a variable Iref.

In step S115, the CPU 10a substitutes a value obtained by subtracting a value of the variable Vref from the value of the variable V1 into a variable $\Delta V$, and substitutes a value obtained by subtracting a value of the variable Iref from a value of the variable I1 into a variable $\Delta I$.

In step S116, the CPU 10a determines whether or not $\Delta V - Z \times \Delta I > Th1$ holds, and if it holds (step S116: Yes), proceeds to step S117, and if not (step S116: No), terminates the process. Z is a static internal resistance of the secondary battery 14, and Th1 is a threshold for determination. Here, the static internal resistance Z is an internal resistance of the secondary battery 14 which is measured when the secondary battery 14 is in an electrically-equilibrated state. This static internal resistance is measured based on changes in the current and the voltage when a pulse discharging is performed at a predetermined cycle by the discharging circuit 15 while the vehicle is at rest. Note that, the below-mentioned cranking resistance is a resistance which is obtained from the current and the voltage detected at the time the engine 17 is started up by the starter motor 18 (when a large current is flowing), and, to the contrary to the static internal resistance, this is referred to as a dynamic internal resistance.

Here, since Ohm's Law holds between the voltage V and the current I of the secondary battery 14 and the internal resistance Z, $\Delta V = Z \times \Delta I$ ($\Delta V - Z \times \Delta I = 0$) is satisfied during a normal time. However, in a case where a blind charging has occurred, although the current I is not detected on the disabled vehicle side, the voltage rises due to a current supply from the rescue vehicle. As a result, on the disabled vehicle side, as shown in FIG. 14, the voltage rises while the current remains unchanged. In FIG. 14, the horizontal axis represents time and the vertical axis represents voltage and current. At a central portion in FIG. 14, a jump start is performed (the secondary batteries are connected with each other via a cable) and during this, $\Delta V - Z \times \Delta I > 0$ holds temporarily. Therefore, in order to detect an occurrence of the blind charging, it is only necessary to detect whether $\Delta V - Z \times \Delta I$ is greater than a predetermined threshold Th1. It is preferable that the threshold Th1 is set at an optimum value depending on a usage environment or the like.

In step S117, the CPU 10a sets the BC detection flag to a state "1" and increments a value of a BC detection counter by one and the BC detection counter is a counter that counts a number of times that the BC detection flag remains in a state "1".

In step S118, the CPU 10a determines whether or not the value of the BC detection counter is greater than a predetermined threshold Th2, and if it is greater (step S118: Yes), proceeds to step S119, and if not (step S118: No), terminates the process. For example, "5" may be used as a concrete value for the threshold Th2. Other values may of course be used.

In step S119, the CPU 10a finalizes the determination that the blind charging has occurred. Also, in order to inform the other devices of an occurrence of blind charging via the communication unit 10d, the CPU 10a sets a blind charging finalization flag to a state "1". Accordingly, since other devices can be informed of the occurrence of blind charging, it is possible to suppress power consumption by, for example, changing an operation mode to a mode which corresponds to blind charging.

Next, a detailed operation of a process of FIG. 13 will be described with reference to FIG. 14. As can be seen in FIG. 14, prior to an occurrence of blind charging (an engine stop state), the voltage V is constant around an intermediate level between 11.75V and 11.80V. At this time, the BC detection flag and the BC counter is set to state "0". In such a state, in step S111, since it is an engine stop state, the process proceeds to step S112 and a substitution of values into variables is carried out. Thereafter, in step S113, since the BC detection flag is "0", it is determined to be "No" and proceeds to step S114. In step S114, a previously measured value V2 is substituted into Vref and, similarly, a previously measured value I2 is substituted into Iref. Then, in step S115, ΔV and ΔI, which are differences between the previous measured values (Vref, Iref) and the present measured values (V1, I1), respectively, are calculated and proceeds to step S116. In step S116, since both ΔV and ΔI are values near zero, it is determined as "No", and terminates the process.

In such a state, assuming that a jump start is performed near the center in FIG. 14 and a blind charging has occurred, the voltage rises to a level near 12.20V. As a result, V1, V2, I1 and I2 come to the values indicated near the center of FIG. 14, and it is determined as "Yes" in step S116, and the process proceeds to step S117. In step S117, the BC detection flag is set to "1" and the BC detection counter is incremented from "0" to "1". As a result, since it is determined as "Yes" in step S113 and the process of step S114 will not be performed, the values of Vref and Iref will be fixed at the values of V2 and I2 before the change shown in FIG. 14, respectively in the subsequent processes. Accordingly, since ΔV and ΔI will be differences between the values of V2 and I2 before the change shown in FIG. 14 and V1 and I1 which are newly detected values, if the voltage and the current are maintaining the values after the change, it is determined as Yes in step S116, and the BC detection counter continues to be incremented. Then, when the value of the BC detection counter becomes greater than Th2, it is determined as "Yes" in step S118. In step S119, the occurrence of blind charging is finalized and the blind charging finalization flag (BC finalization flag) will be a state "1".

When the blind charging is finalized in accordance with the aforementioned process, the blind charging finalization flag will be cancelled in a case where, for example, an adjustment of a value of the correction coefficient is completed with the below-mentioned process of FIG. 20.

With the process described above, the blind charging can be detected positively, since the blind charging is detected based on whether or not ΔV−Z×ΔI>Th1 holds. Also, by setting Th1 appropriately, an influence by noise or the like can be reduced.

Also, with the aforementioned process, since the process is terminated when the engine is started up, a false detection is prevented and processes are omitted. Accordingly, the load on the CPU 10a can be reduced and a consumption power can be reduced.

With the aforementioned process, a BC detection counter is provided and blind charging is finalized when the value of the BC detection counter has exceeded Th2. Accordingly, an occurrence of a false detection can be reduced by avoiding an influence of an unexpected noise.

Next, referring to FIG. 15, a process of detecting the blind discharging will be described. The process of this flowchart is, for example, performed with a certain cycle in a manner similar to the case of FIG. 13. When this flowchart is started, the following steps are performed.

In step S130, the CPU 10a refers to outputs of the voltage sensor 11 and the current sensor 12, and detects the voltage value V and the current value I at that instant.

In step S131, the CPU 10a determines whether blind charging has not been finalized in the process of FIG. 13, and if the blind charging is finalized (step S131: No), terminates the process, and in a case where the blind charging has not been finalized (step S131: Yes), proceeds to step S132. Here, the process is terminated in a case where blind charging has been finalized. This is because blind charging is finalized only in a case where the vehicle is subjected to a jump start as the disabled vehicle, and in such a case, the vehicle does not normally jump start another disabled vehicle.

In step S132, the CPU 10a substitutes the voltage V1 detected in the previous process into V2 and also substitutes the voltage V, which is newly detected in step S130, into V1. Also, the current I1 detected in the previous process is substituted into I2 and the current I, which is newly detected in step S130 is substituted into I1.

In step S133, the CPU 10a determines whether or not a BD (Blind Discharge) detection flag indicating an occurrence of blind discharging is "1", and in a case where it is "1" (step S133: Yes), proceeds to step S135, and if not (step S133: No), proceeds to step S134. The BD detection flag is a flag which is set to "1" at step S137 in a case where it is determined to be Yes in the below-mentioned process of step S136.

In step S134, the CPU 10a substitutes a value of the variable V2 into the variable Vref, and also substitutes a value of the variable I2 into the variable Iref.

In step S135, the CPU 10a substitutes a value obtained by subtracting the value of the variable Vref from the value of the variable V1 into ΔV and substitutes a value obtained by subtracting the value of variable Iref from the value of the variable I1 into ΔI.

In step S136, the CPU 10a determines whether ΔV−Z×ΔI<Th3 holds or not, and in a case where it holds (step S136: Yes), proceeds to step S137, and if not (step S136: No), terminates the process. It is to be noted that, similarly to the case shown in FIG. 13, Z is a static internal resistance.

Here, in a case where the blind discharging has occurred, despite the fact that the current I is not detected on the rescue vehicle side, an electric current is supplied to the disabled vehicle and the voltage of the secondary battery 14 drops. As a result, as shown in FIG. 16, on the rescue vehicle side, the voltage drops while the electric current remains unchanged. Also, in the case of FIG. 16, the horizontal axis indicates time and the vertical axis indicates the voltage and the electric current. A jump start is performed at a central portion in FIG. 16 and during this, ΔV−Z×ΔI<0 holds temporarily. Therefore, in order to detect an occurrence of the blind discharging, it is only necessary to detect whether ΔV−Z×ΔI is smaller than a predetermined threshold Th3. Similarly to the case shown in FIG. 13, it is preferable that the threshold Th3 is set at an optimum value depending on a usage environment or the like.

In step S137, the CPU 10a sets the BD detection flag to a state "1", and also increments a value of a BD detection counter by one. The BD detection counter counts a number of times that the BD detection flag continues to be in a state "1".

In step S138, the CPU 10a determines whether or not the value of the BD detection counter is greater than the predetermined threshold Th4, and in a case where it is greater (step S138: Yes), proceeds to step S139, and if not (step S138: No), terminates the process. As a specific value for the threshold Th4, for example, "5" can be used. A value other than "5" may of course be used.

In step S139, the CPU 10a finalizes the determination that the blind discharging has occurred. Also, in order to inform the other devices of an occurrence of blind discharging via the communication unit 10d, the CPU 10a sets a blind discharging finalization flag (BD finalization flag) to a state "1". Accordingly, since other devices can be informed of the occurrence of blind discharging, it is possible to, for example, suppress power consumption by changing an operation mode to a mode corresponding to blind discharging.

In step S140, the CPU 10a substitutes the value of the variable Vref into a variable Vbd_fix, and terminates the process. The variable Vbd_fix is used in the process of FIG. 17 to be described later.

Also, in a case where the blind discharging is finalized with the aforementioned process, the blind discharging finalization flag is set to a state "0" when, for example, an adjustment of a value of the correction coefficient is completed by a process of FIG. 21 described later.

Next, a specific operation of a process of FIG. 15 will be described with reference to FIG. 16. In a state before occurrence of the blind discharging, the voltage V is constant around an intermediate level between 12.55V and 12.60V. At this time, the BD detection flag and the BD counter are set to a state "0". In such a state, in a case where the blind charging has not been finalized by the process of FIG. 13, since it is determined as "Yes" in step S131, the process proceeds to step S132, and the values are exchanged between the variables. In step S133, since the BD detection flag is "0", the process proceeds to step S134, and V2 and I2 are substituted into Vref and Iref, respectively. Then, in step S135, ΔV and ΔI, which are differences between the previous measured values (Vref, Iref) and the present measured values (V1, I1) are calculated, and the process proceeds to step S136. In step S136, since both ΔV and ΔI are values near 0, it is determined as No, and the process terminates.

In such a state, assuming that a blind discharging has occurred near the center in FIG. 16, the voltage drops to 12.35V or below. As a result, V1, V2, I1 and I2 take the values indicated near the center of the drawings, respectively, and it is determined as Yes in step S136, and proceeds to step S137. In step S137, the BD detection flag is set to "1" and the BD detection counter is incremented from "0" to "1". As a result, since it is determined as Yes in step S133 and the process of step S134 is will not be performed, the values of Vref and Iref will be fixed at the values of V2 and I2 before the change shown in FIG. 16, respectively in the subsequent processes. Accordingly, since ΔV and ΔI will be the differences between the values of V2 and I2 before the change shown in FIG. 16 and V1 and I1 which are newly detected values, if the voltage and the current are maintaining the values after the change, it is determined as Yes in step S136, and the BD detection counter continues to be incremented. Then, when the value of the BD detection counter becomes greater than Th4, it is determined as "Yes" in step S138 and the blind discharging is finalized and the value of Vref is substituted into Vbd_fix in step S140.

According to the aforementioned process, since the blind discharging is detected based on whether −Z×ΔI<Th3 holds or not, the blind discharging can be detected positively. Also, by setting Th3 appropriately, an influenced by noise or the like can be reduced.

Further, considering the fact that it is very rare for the vehicle which has been subjected to a jump start as the disabled vehicle to jump start another disabled vehicle, the process is executed only in a case where blind charging is not finalized. Accordingly, while reducing a false detection by omitting unnecessary processes, the load on the CPU 10a or the like can be reduced.

Also, according to the aforementioned processes, even in a case where the secondary batteries of the rescue vehicle and the disabled vehicle are connected by a connection cable after the rescue vehicle has started up the engine, an occurrence of blind discharging in the rescue vehicle can be detected. FIG. 17 is a diagram illustrating a change in the voltage and the current of the secondary battery 14 of the rescue vehicle in a case where the connection cable is connected in a state where the engine of the rescue vehicle has been started up. Referring to FIG. 17, it is assumed that the batteries are connected with each other by the connection cable at 62.55 seconds shown by an arrow. In this case, when connected by the connection cable, the voltage of the secondary battery 14 of the rescue vehicle drops. Accordingly, ΔV−Z×ΔI<Th3 holds in step S136, and even in such a case, blind discharging can be detected accurately.

Next, referring to FIG. 18, for a case where it is determined that the blind discharging has occurred on the disabled vehicle side due to a temporal power supply from the disabled vehicle to the rescue vehicle, a process of correcting such a determination will be described. For example, it is assumed that, after having connected the connection cable while the engine of the rescue vehicle is being stopped, the engine of the rescue vehicle is started up. In such a case, when starting up the engine of the rescue vehicle, there may be a case in which power is temporarily supplied from the disabled vehicle to the rescue vehicle. In such a case, despite the fact that the power supplied from the rescue vehicle to the disabled vehicle after the engine of the rescue vehicle has been started up is greater than the temporarily supplied power, in the disabled vehicle, due to a power supply at a point of time of starting up the engine, it is determined that blind discharging has occurred in accordance with the aforementioned process of FIG. 15. In such a case, by the process of FIG. 18, the determination of the blind discharging can be changed to the determination of the blind charging. Also, the process of FIG. 18 is performed in a case where the engine of its own vehicle has been stopped. When the process of FIG. 18 is started, the following steps will be performed.

In step S150, the CPU 10a detects the current I and the voltage V.

Figure 15:
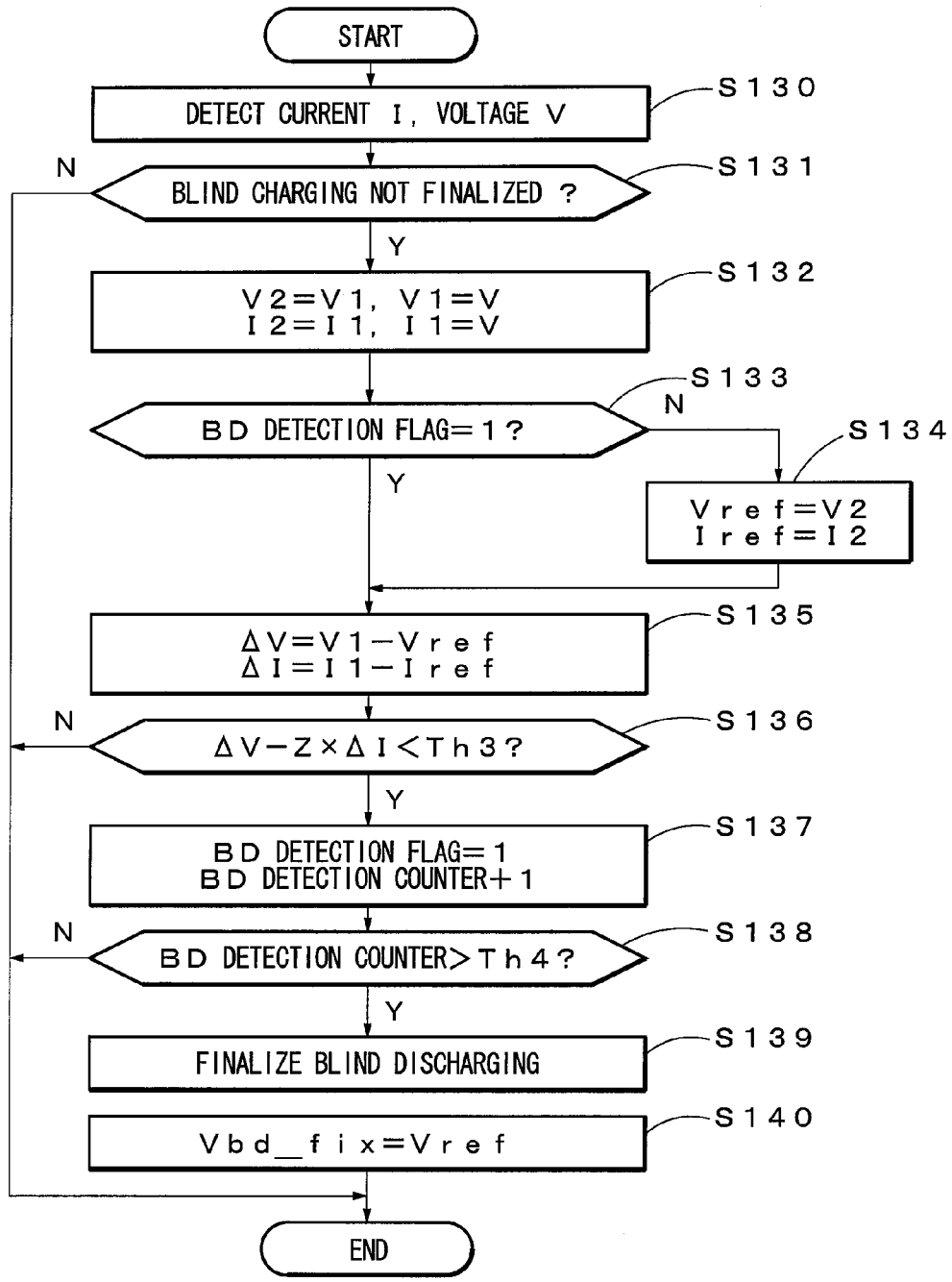
FIG. 15 is a flowchart for detecting blind discharging.

In step S151, the CPU 10a determines whether or not blind discharging has been finalized by the process in FIG. 15, and in a case where it is determined to have been finalized (step S151: Yes), proceeds to step S152, and if not (step S151: No), the process terminates.

In step S152, the CPU 10a determines whether or not it is within a predetermined time Th5 since the blind discharging (BD) has been finalized, and if it is within Th5 (step S152: Yes), the process proceeds to step S153, and if not (step S152: No), the process is terminated. The process of this step S152 is provided so as not to perform the process of correcting the blind discharging to the blind charging at a time other than a predetermined period from the start up of the engine. Here, since the time required for the start-up of the engine is normally about two seconds, a predetermined value which is greater than "2" may be set as Th5.

In step S153, the CPU 10a determines whether or not V−Vbd_fix>Th6 is held, and in a case where it is held (step S153: Yes), proceeds to step S154, and if not (step S153: No), the process is terminated. Here, in Vbd_fix, the voltage before change (V2 in FIG. 16) is stored in step S140 of FIG. 15. Therefore, in a case where a value obtained by subtracting the voltage Vbd_fix before change from the present voltage V is greater than the predetermined threshold Th6, it is indicated that the present voltage is higher than the voltage before change. Such a state is considered as an increase in voltage caused by initiating the power supply from the rescue vehicle to the disabled vehicle by an engine start-up of the rescue vehicle, and in such a case, the process proceeds to step S154.

In step S154, the BD finalization flag is change from "1" to "0", and the BC finalization flag is change from "0" to "1". Thus, the determination of BD detection is corrected to the determination of the BC detection.

Next, referring to FIG. 19, a specific operation of the process shown in FIG. 18 will be described. FIG. 19 is a diagram illustrating a change in voltage and current of the disabled vehicle in a case where the engine of the rescue vehicle is started up after the connection cable has been connected while the engine of the rescue vehicle is being stopped. After the secondary batteries have been connected to each other by the connection cable, if the engine of the rescue vehicle is started up at a point shown by an arrow indicated in FIG. 19, a large electric current will flow through a starter motor in the rescue vehicle. Accordingly, an electric power is supplied from the disabled vehicle to the rescue vehicle. As a result, as shown in FIG. 19, a voltage of the secondary battery of the disabled vehicle drops temporarily. Then, with a process shown in FIG. 15, it is determined that the blind discharging has occurred.

Thereafter, when the process of FIG. 18 is started, since the determination of the blind discharging has been finalized at step S151, it is determined as Yes, and the process proceeds to step S152. At step S152, in a case where it is within a predetermined time Th5 from the finalization of the blind discharging, the process proceeds to step S153. Here, the determination of the blind discharging is carried out at a point where the engine of the rescue vehicle is started up (a point where the starter motor is starts rotating), and generally, the time required for the engine to start up is about two seconds. Therefore, in a case where it is within Th5 (>2 seconds) from the finalization of the blind discharging, the engine of the rescue vehicle has been started up and the power supply from the rescue vehicle to the disabled vehicle has been started. Accordingly, as shown in FIG. 19, the voltage increases from a voltage which was less than or equal to 12V to a voltage which is greater than or equal to 13V. In such a state, it is determined as Yes in step S153 of FIG. 18. In other words, in an example of FIG. 19, a voltage at a point indicated with an arrow is stored in Vbd_fix, and since V is the present voltage, V−Vbd_fix>Th6 is satisfied. Accordingly, it is determined as Yes, and proceeds to step S154, and the BD finalization flag is set to "0", and the BC finalization flag is set to "1". Accordingly, a false determination of blind discharging at the disabled vehicle is corrected to a determination of blind charging.

With the aforementioned process, even if it was determined that blind discharging has occurred in the disabled vehicle, this can be corrected to an occurrence of blind charging.

Next, referring to FIG. 20, for a case where the blind charging has been detected, a process of adjusting the values of the correction coefficients for eliminating the influences of stratification and polarization will be described. The process of FIG. 20 is, for example, a process which is executed at a predetermined cycle. When the process of this flowchart is started, the following steps are performed.

In step S170, the CPU 10a determines whether or not the BC finalization flag is "1", and if it is "1" (step S170: Yes), proceeds to step S171, and if not (step S170: No), the process terminates.

In step S171, the CPU 10a obtains the open circuit voltage OCV2 from a voltage transition. Specifically, as shown in FIG. 5, when the engine 17 is stopped, the voltage of the secondary battery 14 gradually drops with an elapse of time and approaches the open circuit voltage. It is known that a certain correlation exists between a rate of change of the voltage m at a certain point and a difference voltage against the open circuit voltage dV. Accordingly, a table or an equation numerically expressing such a correlation is stored in the RAM 10c, and by looking up the table based on the voltage V and the rate of change m of the secondary battery 14 at a certain point, OCV2 can be determined from a voltage transition of a short time without having to wait for several tens of hours.

In step S172, the CPU 10a acquires a final update value of the open circuit voltage OCV1 which is determined by current integration and stored in the RAM 10c as the parameter 10ca. Here, the current integration is a method of determining the charging rate of the secondary battery 14 by always measuring the current value which is discharged or charged from/to the secondary battery 14 and performing an integration of the current measurement values. Since a substantially linear relationship exists between the open circuit voltage OCV1 and the charging rate SOC1, based on such a relationship, the open circuit voltage OCV1 can be determined from the charging rate SOC1. The calculation of the open circuit voltage OCV1 and the charging rate SOC1 in accordance with current integration is performed at a predetermined time interval, and the obtained open circuit voltage OCV1 and the charging rate SOC1 are stored in the RAM 10c by overwriting as the parameter 10ca.

In step S173, the CPU 10a obtains the polarization correction coefficient C1r by applying a difference (OCV1−OCV2) between the open circuit voltage OCV1 and the open circuit voltage OCV2 to a function f1 ( ) for determining the polarization correction coefficient C1r. Here, the polarization correction coefficient C1r is defined as a coefficient for correcting the amount of polarization C1, which is possessed in the control unit 10 as an estimated value for eliminating an error due to polarization, in accordance with detection of the blind charging. Specifically, in a case where the blind charging has been detected, for example, C1←C1−C1r ("←" represents substitution of a value into a variable) is performed and the amount of polarization C1 is corrected.

Here, the open circuit voltage OCV1 is determined by current integration. Therefore, in a case where blind charging is performed, since the electric current which flows into and out of the other secondary battery cannot be detected with the current sensor 12, the current that is flowing during this is not reflected into open circuit voltage OCV1. On the other hand, the open circuit voltage OCV2 is determined with a method (details will be described later) which is different from current integration, and with such a method, OCV2 is measured with the electric current flowing into and out of the other secondary battery being included. Therefore, a value of the difference between these (OCV1−OCV2) for a case where blind charging is executed becomes greater than for a case where blind charging is not executed. Thus, as an exemplary method of realizing the function f1 ( ), for example, a table in which the value of (OCV1−OCV2) and the polarization correction coefficient C1r are associated is prepared in advance in the RAM 10c, and the polarization correction coefficient C1r can be obtained by applying the aforementioned value of the difference to said table.

In step S174, the CPU 10a determines the stratification correction coefficient C2r by applying a difference (OCV1−OCV2) between the open circuit voltage OCV1 and the open circuit voltage OCV2 to a function f2( ) for determining the stratification correction coefficient C2r. Here, the stratification correction coefficient C2r is defined as a coefficient for correcting the amount of stratification C2, which is possessed in the control unit 10 as an estimated value for eliminating an error due to stratification, in accordance with a detection of the blind charging. Specifically, in a case where the blind charging has been detected, for example, C2←C2−C2r is performed and the amount of stratification C2 is corrected. It is to be noted that the relationship between the open circuit voltage OCV1 and the open circuit voltage OCV2 is similar to the aforementioned case, and also, similarly to the aforementioned case, a table representing a relationship between the stratification correction coefficient C2r and (OCV1−OCV2) is prepared in advance in the RAM 10c, and by determining based on said table, the stratification correction coefficient C2r can be obtained.

With the aforementioned processes, the polarization correction coefficient C1r and the stratification correction coefficient C2r are obtained. By using such a correction coefficient, even in a case where stratification and polarization has changed due to an occurrence of the blind charging, the amount of stratification and the amount of polarization after the change can be obtained by correcting the amount of stratification and the amount of polarization before the change with these correction coefficients.

Next, referring to FIG. 21, a process of adjusting the value of the correction coefficient for eliminating an influence of polarization will be described for a case where blind discharging is detected. The process of FIG. 21 is, for example, a process which is executed with a predetermined cycle. When this flowchart is started, the following steps are executed.

In step S180, the CPU 10a determines whether or not the BD finalization flag is "1", and in a case where it is "1" (step S180: Yes), proceeds to step S181, and if not (step S180: No), terminates the process.

In step S181, the CPU 10a determines the open circuit voltage OCV2 from the voltage transition. It is to be noted that, since this process is similar to the process of step S171 of FIG. 20, the detailed explanation will be omitted.

In step S182, the CPU 10a obtains a final update value of the open circuit voltage OCV1 determined by current integration and stored in the RAM 10c as the parameter 10ca. Also, since this process is similar to the process of step S172 of FIG. 20, a detailed explanation will be omitted.

In step S183, the CPU 10a determines the stratification correction coefficient C3r by applying a difference (OCV1−OCV2) between the open circuit voltage OCV1 and the open circuit voltage OCV2 to a function f3( ) for determining the stratification correction coefficient C3r. Here, the stratification correction coefficient C3r is defined as a coefficient for correcting the amount of stratification C2, which is possessed in the control unit 10 as an estimated value for eliminating an error due to stratification, in accordance with a detection of the blind discharging. Specifically, in a case where the blind discharging has been detected, for example, C2←C2−C3r ("←" represents substitution of a value into a variable) is performed and the amount of stratification C2 is corrected. Since the function f3( ) is obtained in a manner similar to the case of f2( ), an explanation thereof is omitted.

In the case of blind discharging, since an influence on the estimation of the charging rate is more significant in the case of stratification than in the case of polarization and the influence by polarization is very small, calculation of the polarization correction coefficient is omitted from the process of FIG. 21, since it will not be particularly problematic.

With the process described above, the stratification correction coefficient C3r is obtained. By using such a correction coefficient, even if the amount of stratification has changed due to an occurrence of blind discharging, the amount of stratification after the change can be obtained by correcting the amount of stratification before change using these correction coefficients.

Then, referring to FIG. 22, a process of discarding the cranking resistance R will be described. The process shown by the flowchart illustrated in FIG. 22 is, for example, executed at a certain time interval. When the process of FIG. 22 is started, the following steps are carried out.

In step S190, the CPU 10a determines whether or not the BC finalization flag or the BD finalization flag is "1", and in a case where it is "1" (step S190: Yes), proceeds to step S191, and if not (step S190: No), terminates the process.

In step S191, the CPU 10a discards the cranking resistance R which was measured during cranking (the engine 17 being rotated and driven by the starter motor 18) at the time of a jump start and stored in the RAM 10c as the parameter 10ca. Here, the cranking resistance R is defined as a real component of impedance which is determined based on an electric current, which flows from the secondary battery 14 to the starter motor 18 when the engine 17 is rotated and driven by the starter motor 18, and the terminal voltage of the secondary battery. In other words, for the cranking at the time of a jump start, due to the occurrence of blind charging or blind discharging, a cranking resistance R cannot be determined accurately. Accordingly, such a cranking resistance R is discarded. Therefore, a false determination based on the cranking resistance containing an error can be prevented.

In a case where a blind charging has occurred, the BC finalization flag to is set to a state "0" after the processes of FIGS. 20 and 22, and in a case where a blind discharging has occurred, BD finalization flag is set to a state "0" after the processes of FIGS. 20 and 22. Accordingly, it is possible to prepare for an occurrence of a new blind charging or a new blind discharging.

(E) Explanation of Variant Embodiments

The aforementioned embodiment has been described by way of example and the present invention is not limited to a case mentioned above. For example, the aforementioned embodiment has been explained based on an exemplary case where a jump start is executed, but the "irregular charging-discharging" used herein is not limited thereto. For example, charging using a charger that charges a secondary battery by converting a commercial supply power to a direct current power or connecting an external appliance (e.g., an inverter that converts the direct current power to an alternating current power) to the secondary battery may be detected as an irregular charging-discharging.

Although in the aforementioned embodiment, a jump start which is an irregular charging-discharging is detected in accordance with equation (1), an equation other than this may be used. For example, determination may be made in accordance with the following equation (2) using conductance G instead of impedance.

$$D = \Delta I - G \times \Delta V \quad (2)$$

Alternatively, by using a certain constant K instead of the static impedance Z, it can be determined that an irregular charging-discharging has been carried out when a difference between $\Delta I \times K$ and $\Delta V$ has changed.

Further, as for the amount of polarization and the amount of stratification, corrections are made in accordance with equations shown in steps S23, S24, S173, S174 and S183, but corrections may also be made in accordance with equations other than these equations. Further, although the amount of polarization and the amount of stratification are corrected individually, these may also be gathered into a single amount and corrected in as a whole.

Further, in the aforementioned embodiment, in order to detect both the disabled vehicle and the rescue vehicle, an occurrence of a jump start is determined by comparing an absolute value of D and the threshold Th by the process of step S7 in FIG. 6. Here, on the rescue vehicle side, since the amount of polarization and the amount of stratification decreases due to a jump start, an influence of the amount of polarization and the amount of stratification is small as compared to the disabled vehicle side. However, on the rescue vehicle side, since the current is drawn out due to a jump start, an actual charging rate will be lower than the charging rate detected by the sensor. In this case, when the secondary battery 14 is used based on the detected charging rate, the secondary battery 14 may be exhausted. Accordingly, for example, after having set the jump start occurrence flag to "1" in the process of step S8 in FIG. 6, if D is positive, the processes of FIGS. 9 and 11 may be performed, and, if D is negative, for example, only the process of FIG. 11 may be performed without the process of FIG. 9 being performed and notification can be made notifying that the charging rate is lower than the detected charging rate and the charging rate may be recalculated as necessary. In other words, the processes performed by the disabled vehicle and the rescue vehicle may be separated. Further, in a case where D is negative, if necessary, the process of FIG. 9 may be performed in addition to the process of FIG. 11.

What is claimed is:

1. A secondary battery state detecting apparatus for detecting a state of a secondary battery installed in a vehicle, comprising:
    a current detecting unit that detects an electric current flowing to the secondary battery;
    a voltage detecting unit that detects a voltage of the secondary battery; and
    a determining unit that determines, in a case where an external device is directly connected to terminals of the secondary battery and the secondary battery is charged or discharged without passing through the current detecting unit, whether or not an irregular charging-discharging has occurred, in accordance with a change in a current value and a voltage value detected by the current detecting unit and the voltage detecting unit.

2. The secondary battery state detecting apparatus according to claim 1, wherein the determining unit determines, in a case where the secondary batteries of the vehicle and another vehicle are connected to each other via a cable in order to rescue an exhausted state of the secondary battery of the vehicle or the other vehicle, whether a blind charging or a blind discharging has occurred in the secondary battery of the vehicle, in accordance with a relationship between a change in the current value and a change in the voltage value detected by the current detecting unit and the voltage detecting unit, the blind charging being an irregular charging in which charging is performed without passing through the current detecting unit, the blind discharging being an irregular discharging in which discharging is performed without passing through the current detecting unit has occurred.

3. The secondary battery state detecting apparatus according to claim 1, further comprising a state detection unit that detects a state of the secondary battery by referring to the current value and the voltage value detected by the current detecting unit and the voltage detecting unit as well as a determination result of the determining unit.

4. The secondary battery state detecting apparatus according to claim 3, wherein, in a case where the determining unit has determined that the irregular charging-discharging has occurred, the state detection unit discards an impedance value of the secondary battery which was measured when the irregular charging-discharging has occurred.

5. The secondary battery state detecting apparatus according to claim 1, wherein in a case where the determining unit has determined that the irregular charging-discharging has occurred, another apparatus is informed of an occurrence of the irregular charging-discharging.

6. The secondary battery state detecting apparatus according to claim 2, wherein the determining unit determines blind charging or blind discharging depending on whether a value obtained by $\Delta V - \Delta I \times Z$ is positive or negative, where $\Delta I$ is a change in an electric current detected by the current detection unit, $\Delta V$ is a change in a voltage detected by the voltage detecting unit, and Z is an internal resistance of the secondary battery.

7. The secondary battery state detecting apparatus according to claim 6, wherein the determining unit has thresholds each corresponding to a positive value or a negative value obtained by $\Delta V - \Delta I \times Z$, and determines whether blind charging or blind discharging has occurred in accordance with a comparison with the thresholds.

8. The secondary battery state detecting apparatus according to claim 7, wherein the determining unit is operable, when the value obtained by $\Delta V - \Delta I \times Z$ has exceeded the positive or negative threshold, to fix previously measured voltage and current values as reference values among voltage values and current values on which determination have been performed and to obtain $\Delta V$ and $\Delta I$ based on the reference values and latest voltage and current values, and is operable, when the value obtained by $\Delta V - \Delta I \times Z$ has been continuously exceeding the positive or negative threshold for a certain period, to determine that the blind charging or the blind discharging has occurred.

9. The secondary battery state detecting apparatus according to claim 2, wherein the determining unit performs the determination of the blind charging only in a case where the engine of the vehicle has been stopped.

10. The secondary battery state detecting apparatus according to claim 2, wherein the determining unit does not perform the determination of blind discharging until an engine of the vehicle is stopped, in a case where it is determined that blind charging has occurred.

11. The secondary battery state detecting apparatus according to claim 2, wherein the determining unit corrects, even in a case where it is determined that the blind discharging has occurred, the determination such that the blind charging has occurred in a case where the voltage has risen as compared to the case before the change.

12. The secondary battery state detecting apparatus according to claim 2, further comprising a state detecting unit that estimates a state of the secondary battery in consideration of an amount of change of a polarization phenomenon or a stratification phenomenon caused by blind charging or blind discharging.

13. A secondary battery state detecting method of detecting a state of the secondary battery installed in a vehicle by referring to detection results of a current detecting unit and a voltage detecting unit, comprising:
    determining, in a case where an external device is directly connected to terminals of the secondary battery and the secondary battery is charged or discharged without passing through the current detecting unit, whether or not an irregular charging-discharging has occurred, in accordance with a change in the current value and the voltage value detected by the current detecting unit and the voltage detecting unit.

14. The method according to claim 13 wherein said determining whether or not an irregular charging or discharging has occurred is performed by a processor in cooperation with a memory.

* * * * *